US009646637B1

(12) United States Patent
Xiong et al.

(10) Patent No.: US 9,646,637 B1
(45) Date of Patent: May 9, 2017

(54) THIN-FILM PIEZOELECTRIC MATERIAL ELEMENT, HEAD GIMBAL ASSEMBLY AND HARD DISK DRIVE

(71) Applicant: SAE Magnetics (H.K.) Ltd., Hong Kong (CN)

(72) Inventors: Wei Xiong, Hong Kong (CN); Atsushi Iijima, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 0 days.

(21) Appl. No.: 14/933,470

(22) Filed: Nov. 5, 2015

(51) Int. Cl.
*G11B 5/48* (2006.01)
*H01L 41/047* (2006.01)

(52) U.S. Cl.
CPC .......... *G11B 5/483* (2015.09); *H01L 41/0471* (2013.01)

(58) Field of Classification Search
CPC .......... G11B 5/48; G11B 5/483; G11B 5/4873
USPC .......... 360/294.3–294.6, 245.3, 245.8, 245.9
See application file for complete search history.

(56) References Cited

U.S. PATENT DOCUMENTS

| 6,931,700 | B2 | 8/2005 | Uchiyama | |
|---|---|---|---|---|
| 7,006,334 | B2 | 2/2006 | Uchiyama | |
| 7,064,401 | B2 * | 6/2006 | Uchiyama | H01L 41/0986 257/254 |
| 8,885,294 | B2 | 11/2014 | Kudo | |
| 2001/0046107 | A1 * | 11/2001 | Irie | G11B 5/4806 360/294.4 |
| 2015/0207057 | A1 * | 7/2015 | Sakuma | B41J 2/14201 360/294.4 |
| 2016/0035810 | A1 * | 2/2016 | Park | H01L 27/3265 257/40 |
| 2016/0093792 | A1 * | 3/2016 | Xiong | H01L 41/0815 360/294.4 |
| 2016/0155858 | A1 * | 6/2016 | Yoo | H01L 29/78648 257/40 |

FOREIGN PATENT DOCUMENTS

JP 2014-106985 6/2014

* cited by examiner

*Primary Examiner* — Allen T Cao
(74) *Attorney, Agent, or Firm* — Nixon & Vanderhye PC

(57) ABSTRACT

A thin-film piezoelectric material element includes a laminated structure part having a lower electrode film, a piezoelectric material film laminated on the lower electrode film and an upper electrode film laminated on the piezoelectric material film. The thin-film piezoelectric material element includes a surface layer insulating film disposed on side surfaces of the laminated structure part and a top surface of the upper electrode film, and has a through hole formed on a top disposed part disposed on the top surface. The surface layer insulating film has a long-side disposed part disposed outside than the top disposed part, the long-side disposed part has a long-side width, along with the long-side direction, formed shorter than the through hole.

11 Claims, 27 Drawing Sheets

THIN-FILM PIEZOELECTRIC MATERIAL ELEMENT, HEAD GIMBAL ASSEMBLY AND HARD DISK DRIVE

BACKGROUND

Field of the Invention

The present invention relates to a thin-film piezoelectric material element which has a piezoelectric material and electrodes having thin-film like shape, head gimbal assembly and hard disk drive having the thin-film piezoelectric material element.

Related Background Art

A hard disk drive has a large recording capacity and is used as the heart of a storage device. The hard disk drive records and reproduces data to/from a hard disk (recording medium) by a thin-film magnetic head. A part, which the thin-film magnetic head is formed, is called as a head slider, and a part, which the head slider is mounted on the edge part, is a head gimbal assembly (will also be referred to as HGA).

Further, recording and reproducing of data to/from the recording medium is performed by flying the head slider from a surface of the recording medium while rotating the recording medium, in the hard disk drive.

On the other hand, it has become difficult to control a position of the thin-film magnetic head accurately by control with only a voice coil motor (VCM), because heightening a recording density of the recording medium has developed in company with increase of a capacity of the hard disk drive. Therefore formerly, a technology, which an actuator having supplementary function (a supplementary actuator) is mounted on the HGA in addition to a main actuator with the VCM, and the supplementary actuator controls a minute position that is not able to be controlled by the VCM, is known.

A technology, which the main actuator and the supplementary actuator control the position of the thin-film magnetic head, is also called two stage actuator system (dual-stage system).

In the two stage actuator system, the main actuator makes drive arms rotate to decide a position of the head slider on a specific track of the recording medium. Further, the supplementary actuator adjusts the position of the head slider minutely so that the position of the thin-film magnetic head may become an optimum position.

A micro actuator using a thin-film piezoelectric material element is known formerly as the supplementary actuator. The thin-film piezoelectric material element has a piezoelectric material and a pair of electrodes formed to sandwich the piezoelectric material, and each of them is formed to be a thin-film shape.

Further, a technology, which displacement stroke of the element is increased to increase the displacement control amount of the magnetic head, is conventionally known (for example, see U.S. Pat. No. 8,885,294 (referred also to as Patent Document 1)). The HGA having a following structure is disclosed in the patent document 1. The HGA has the structure which the piezoelectric material element is fixed to the bottom of concave part formed on a gimbal part. It is possible to prevent the stroke of expansion or shrinking of the thin-film piezoelectric material element from escaping in a curved direction, thereby the displacement stroke of thin-film piezoelectric material element increase.

On the other hand, to avoid electrical shorting between the upper electrode film and the lower electrode film, the piezoelectric material element, which the insulating layer made of oxide or poly-imide are formed to wrap on the top surface and side surfaces of four direction of piezoelectric material, is known (for example, see U.S. Pat. No. 6,931,700 (referred to also as Patent Document 2), U.S. Pat. No. 7,006,334 (referred to also as Patent Document 3)). An opening of the insulating layer is formed on the top surface of the piezoelectric material so that the top surface of the piezoelectric material is exposed, in these thin-film piezoelectric material elements. Further, the HGA, having a flexure including a structure with the piezoelectric element, is disclosed in JP 2014-106985 (referred to also as Patent Document 4). The thin-film piezoelectric material element is fixed to the flexure, in the HGA.

SUMMARY OF THE INVENTION

As mentioned in the above-described Patent Documents 2-3, thin-film piezoelectric material elements having a structure, which the opening (or via hole) is formed in the insulating layer for securing electrical conduction with piezoelectric material, and an electrode layer is formed on the opening (referred to also as "opening and electrode structure"), is known. The electrode layer is extended from the opening to the outside of the thin-film piezoelectric material element along with the surface of the insulating layer, for securing electrical connection with the outside and electrical supply from the outside, in thin-film piezoelectric material elements disclosed in these documents.

By the way, if an area for mounting the thin-film piezoelectric material element is secured widely in the HGA, an area for mounting the opening and electrode (referred to also as "opening and electrode area") is able to be secured even which side of an area along with the width direction of piezoelectric material (referred to also as "width direction area") and an area along with the length direction of piezoelectric material (referred to also as "length direction area").

In this case, because the piezoelectric material expands and shrinks along with the length direction, if the opening and electrode area is secured in the width direction area, it does not affect length of the piezoelectric material, and it does not affect expanding and shrinking motion of the piezoelectric material. Therefore, it is preferable that the opening and electrode area is secured in the width direction area.

However, a space for accommodating the opening and electrode layer is not able to be secured in the width direction area of the HGA. Therefore, the opening and electrode area needs to be secured in the length direction area.

If the electrode layer is extended along with length direction of the piezoelectric material, it needs shortening of length of the piezoelectric material. In this case, extension of the electrode layer affects expanding and shrinking motion of the piezoelectric material.

On the other hand, concerning a pair of the thin-film piezoelectric material elements, from reliability point of view, it is necessary to keep opening and electrode layer not moving while the other thin-film piezoelectric material element expands and shrinks under the driving voltages. This can be done by make the piezoelectric material elements inactive by overlapping with parts having strong mechanical strength such as stainless substrate.

Further, in case of the thin-film piezoelectric material element overlapped on the stainless substrate, a stroke for expanding and shrinking motion of the thin-film piezoelectric material element is proportional to the length of thin-film piezoelectric material element without overlapping with the stainless substrate, defined as "active length". Extension of the active length causes increase of the stroke. Accordingly, it is always the goal to design active thin-film piezoelectric material element with active length as longer as possible.

However, the opening and electrode area is secured in the length direction area, in case of the conventional thin-film piezoelectric material element having the opening and electrode structure. Therefore, the active length is limited by the length of total thin-film piezoelectric material element minus length of the opening and electrode area. Further, in accordance with increasing size of the opening and needed electrode layer length, it brings more difficulty about extending of the active length of the thin-film piezoelectric material element.

The present invention is made to solve the above problem, and it is an object to extend the active length, and increase the stroke while having the opening and electrode structure positioned in a long-side direction, in the thin-film piezoelectric material element, head gimbal assembly and hard disk drive.

To solve the above problem, the present invention is a thin-film piezoelectric material element including: a laminated structure part including a lower electrode film, a piezoelectric material film laminated on the lower electrode film and an upper electrode film laminated on the piezoelectric material film; a surface layer insulating film disposed on side surfaces of the laminated structure part and a top surface of the upper electrode film, and has a through hole formed on a top disposed part disposed on the top surface; and an upper electrode pad being in directly contact with an inside exposed surface, exposed inside the through hole, of the upper electrode film; the upper electrode pad arranged entirely inside an outer edge part of the top disposed part, and formed without contact with a side disposed part, formed along with side surfaces of the laminated structure part, of the surface layer insulating film.

In case of the above-described thin-film piezoelectric material element, because the upper electrode pad is arranged entirely inside the outer edge part of the top disposed part, and formed without contact with the side disposed part, larger space than the conventional one is secured in the long-side direction of the thin-film piezoelectric material element.

Further, in case of the above-described thin-film piezoelectric material element, it is preferable that the upper electrode pad has a long pad-length along with a long-side direction of the thin-film piezoelectric material element and a short pad-length along with a short-side direction of the thin-film piezoelectric material element, the long pad-length is shorter than the short pad-length.

Further, the upper electrode pad has an outer end surface formed outside than the top disposed part, the outer end surface is formed entirely flat, and disposed inside than the outer edge part of the top disposed part.

It is preferable that the surface layer insulating film has a long-side disposed part disposed outside than the top disposed part along with a long-side direction of the thin-film piezoelectric material element, the long-side disposed part has a long-side width, along with the long-side direction, formed shorter than the through hole.

Furthermore, the inside exposed surface has a non pad-contact surface, formed partially, being out of contact with the upper electrode pad.

It is possible that the upper electrode pad is formed smaller than the inside exposed surface, the non pad-contact surface is formed so as to surround the upper electrode pad.

Further, it is possible that the outer end surface is disposed entirely inside the through hole.

It is preferable that the outer end surface has an extended part disposed outside than the through hole, the extended part is disposed inside than the outer edge part of the top disposed part.

Further, the present invention provides a thin-film piezoelectric material element including: a laminated structure part including a lower electrode film, a piezoelectric material film laminated on the lower electrode film and an upper electrode film laminated on the piezoelectric material film; and a surface layer insulating film disposed on side surfaces of the laminated structure part and a top surface of the upper electrode film, and has a through hole formed on a top disposed part disposed on the top surface; the surface layer insulating film has a long-side disposed part disposed outside than the top disposed part along with a long-side direction of the thin-film piezoelectric material element, the long-side disposed part has a long-side width, along with the long-side direction, formed shorter than the through hole.

Further, the present invention provides a head gimbal assembly including a head slider having a thin-film magnetic head; a suspension for supporting the head slider; and a thin-film piezoelectric material element for displacing the head slider relatively to the suspension; the thin-film piezoelectric material element including: a laminated structure part including a lower electrode film, a piezoelectric material film laminated on the lower electrode film and an upper electrode film laminated on the piezoelectric material film; a surface layer insulating film disposed on side surfaces of the laminated structure part and a top surface of the upper electrode film, and has a through hole formed on a top disposed part disposed on the top surface; and an upper electrode pad being in directly contact with an inside exposed surface, exposed inside the through hole, of the upper electrode film; the upper electrode pad arranged entirely inside an outer edge part of the top disposed part, and formed without contact with a side disposed part, formed along with side surfaces of the laminated structure part, of the surface layer insulating film.

In case of the above-described head gimbal assembly, it is preferable that the upper electrode pad has an outer end surface formed outside than the upper disposed part, the outer end surface is formed entirely flat, and disposed inside than the outer edge part of the top disposed part, the head gimbal assembly further including: a suspension pad formed on the suspension; and a connecting electrode which connects the outer end surface with the suspension pad.

Further, the present invention provides a head gimbal assembly including a head slider having a thin-film magnetic head; a suspension for supporting the head slider; and a thin-film piezoelectric material element for displacing the head slider relatively to the suspension; the thin-film piezoelectric material element including: a laminated structure part including a lower electrode film, a piezoelectric material film laminated on the lower electrode film and an upper electrode film laminated on the piezoelectric material film; and a surface layer insulating film disposed on side surfaces of the laminated structure part and a top surface of the upper electrode film, and has a through hole formed on a top disposed part disposed on the top surface; the surface layer insulating film has, a long-side disposed part disposed outside than the top disposed part along with a long-side direction of the thin-film piezoelectric material element, the long-side disposed part has a long-side width, along with the long-side direction, formed shorter than the through hole.

In the above-described head gimbal assembly, it is preferable that the head gimbal assembly, further including: a suspension pad formed on the suspension; and a connecting electrode which connects an inside exposed surface, exposed inside the through hole of the upper electrode film, with the suspension pad.

Further, the present invention provides a hard disk drive including a head gimbal assembly including a head slider having a thin-film magnetic head, a suspension for supporting the head slider, a thin-film piezoelectric material element for displacing the head slider relatively to the suspension; and a recording medium; the thin-film piezoelectric material element including: a laminated structure part including a lower electrode film, a piezoelectric material film laminated on the lower electrode film and an upper electrode film laminated on the piezoelectric material film; surface layer insulating film disposed on side surfaces of the laminated structure part and a top surface of the upper electrode film, and has a through hole formed on a top disposed part disposed on the top surface; and an upper electrode pad being in directly contact with an inside exposed surface, exposed inside the through hole, of the upper electrode film; the upper electrode pad arranged entirely inside an outer edge part of the top disposed part, and formed without contact with a side disposed part, formed along with side surfaces of the laminated structure part, of the surface layer insulating film.

Further, the present invention provides a hard disk drive including a head gimbal assembly including a head slider having a thin-film magnetic head, a suspension for supporting the head slider, a thin-film piezoelectric material element for displacing the head slider relatively to the suspension; and a recording medium; the thin-film piezoelectric material element including: a laminated structure part including a lower electrode film, a piezoelectric material film laminated on the lower electrode film and an upper electrode film laminated on the piezoelectric material film; and a surface layer insulating film disposed on side surfaces of the laminated structure part and a top surface of the upper electrode film, and has a through hole formed on a top disposed part disposed on the top surface; the surface layer insulating film has a long-side disposed part disposed outside than the top disposed part along with a long-side direction of the thin-film piezoelectric material element, the long-side disposed part has a long-side width, along with the long-side direction, formed shorter than the through hole.

In case of the above-described hard disk drive, it is preferable that the hard disk drive further including: a suspension pad formed on the suspension; and a connecting electrode which connects an inside exposed surface, exposed inside the through hole of the upper electrode film, with the suspension pad.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of HGA)

Figure 1:
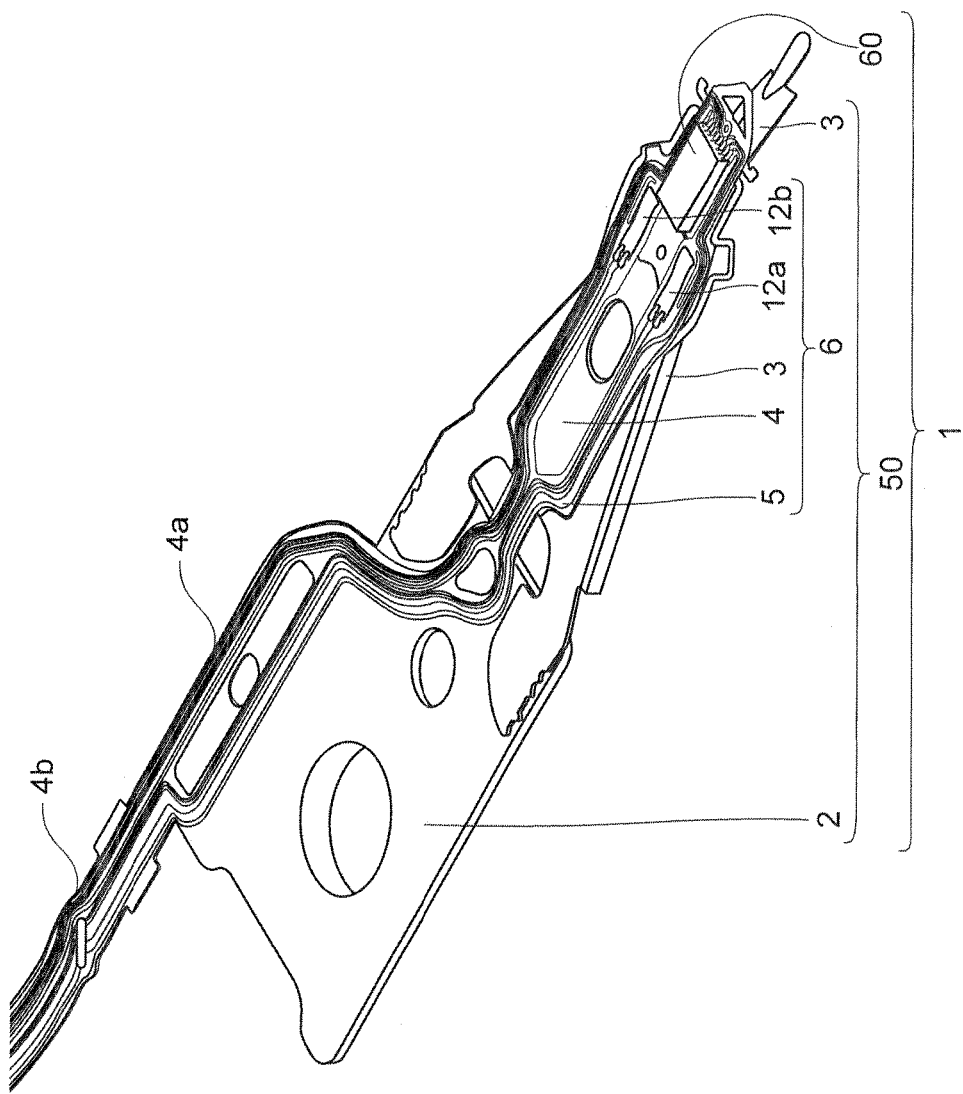
FIG. 1 is a perspective view showing a whole of the HGA, from front side, according to an embodiment of the present invention.
Figure 2:
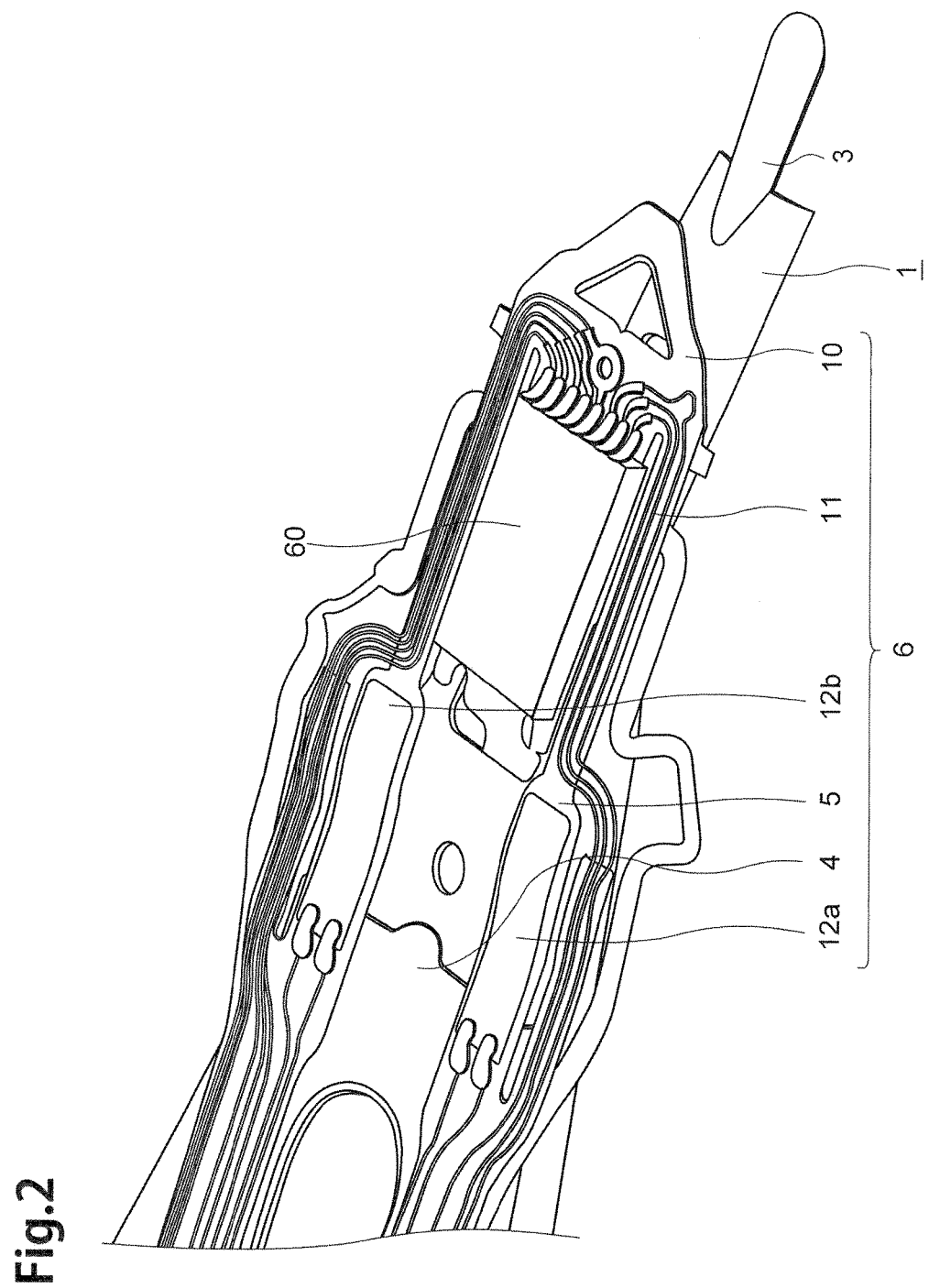
FIG. 2 is a perspective view showing, from front side, a principal part of the HGA in FIG. 1.
Figure 3:
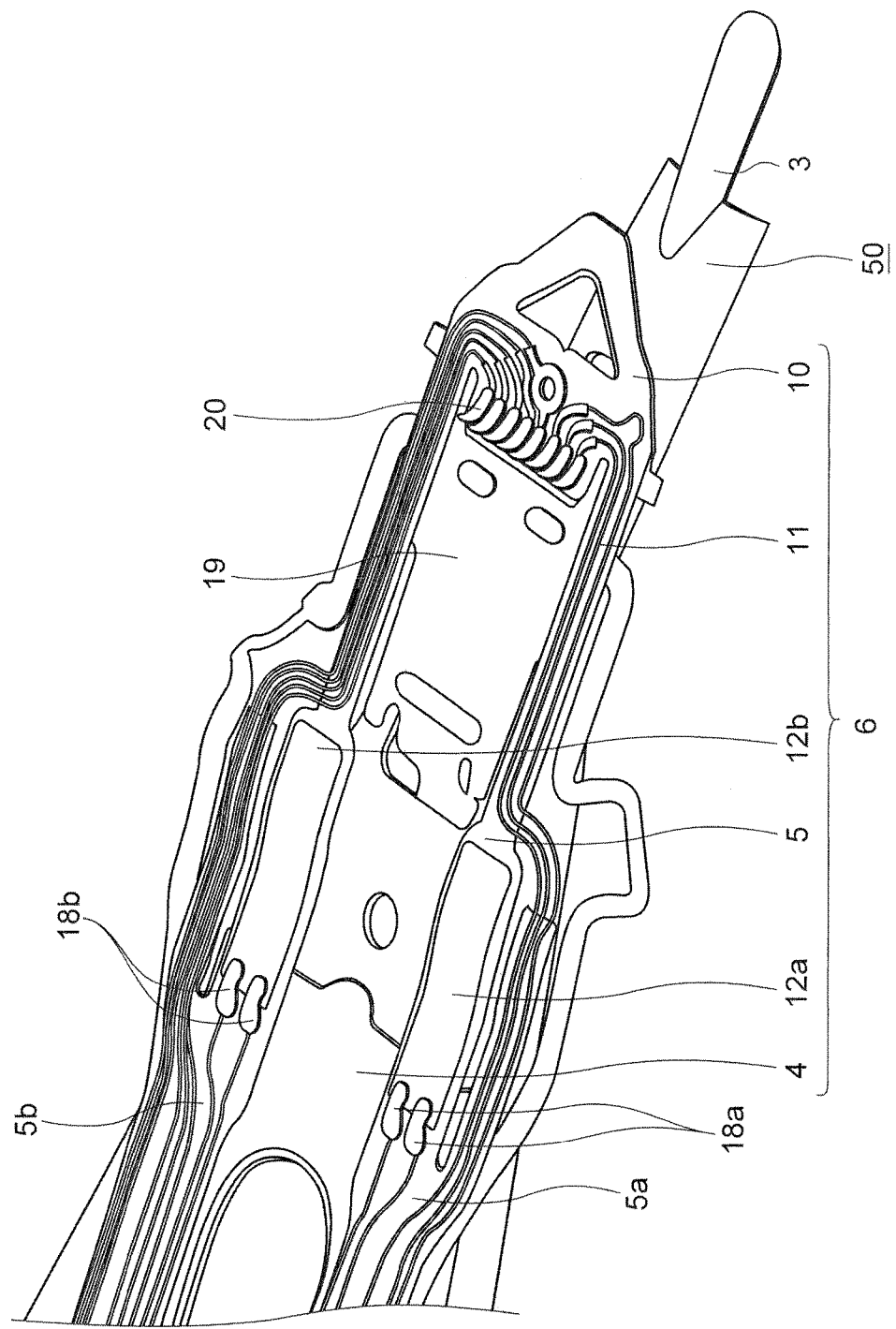
FIG. 3 is a perspective view showing a principal part of a suspension constituting the HGA in FIG. 1 from front side.
Figure 4:
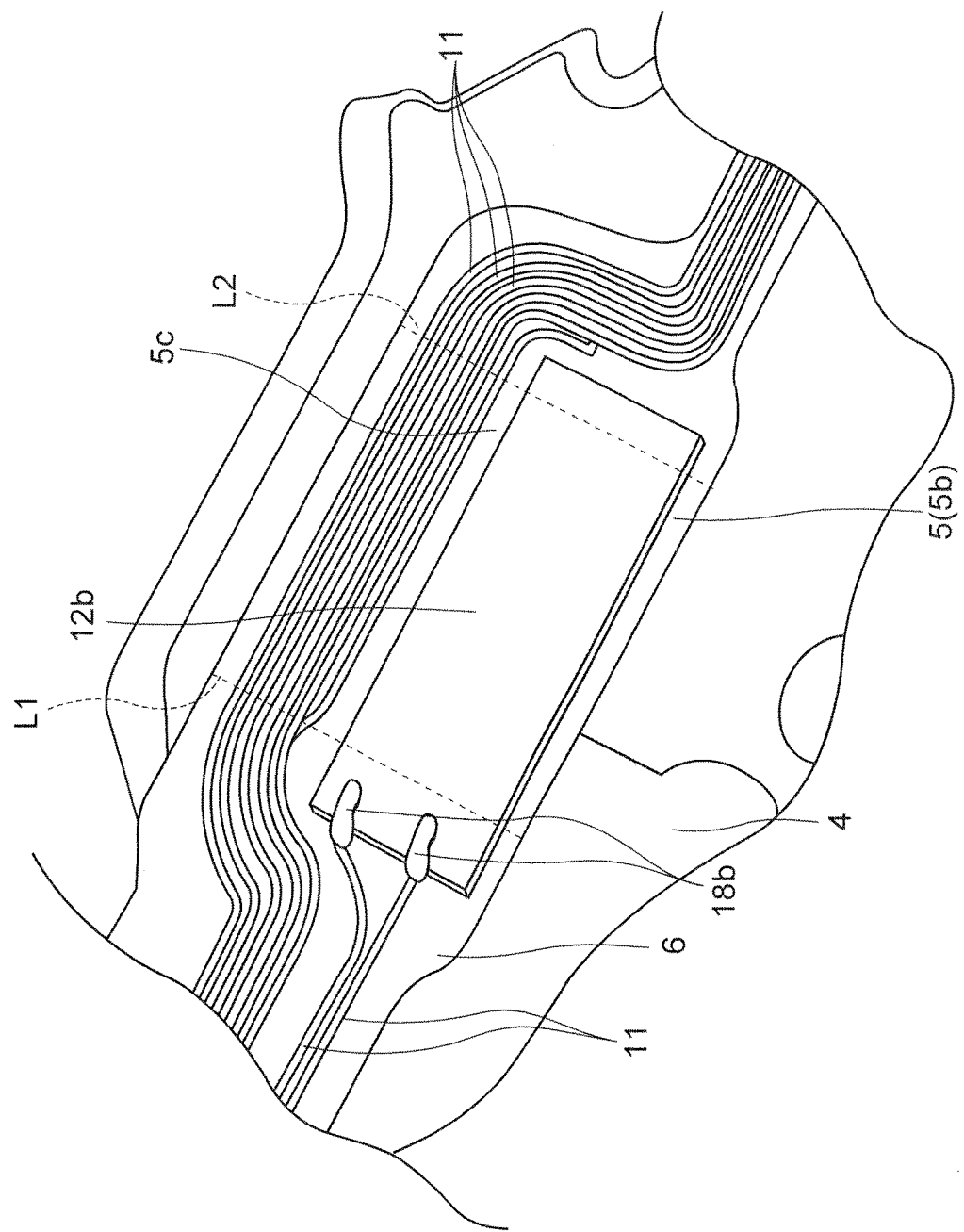
FIG. 4 is a perspective view showing a part, which a thin-film piezoelectric material element is fixed, of flexure with enlargement.

To begin with, a structure of the HGA according to the embodiment of the present invention will be explained with reference to FIG. 1 to FIG. 4. Here, FIG. 1 is a perspective view showing a whole of the HGA 1, from front side, according to an embodiment of the present invention. FIG. 2 is a perspective view showing a principal part of the HGA 1 from front side. FIG. 3 is a perspective view showing a principal part of the suspension 50 constituting the HGA 1 from front side. Further, FIG. 4 is a perspective view showing a part, which a thin-film piezoelectric material element 12b is fixed, of a flexure 6 with enlargement.

As illustrated in FIG. 1, the HGA 1 has the suspension 50 and a head slider 60. The suspension 50 has a base plate 2, a load beam 3, the flexure 6 and a dumper not illustrated, and it has a structure which these parts are joined to be united one body by a weld and so on.

The base plate 2 is a part which is used to fix the suspension 50 to a drive arms 209 of a later-described hard disk drive 201, and it is formed with a metal such as stainless steel or the like.

The load beam 3 is fixed on the base plate 2. The load beam 3 has a shape in which the width gradually decreases as it is distanced more from the base plate 2. The load beam 3 has a load bending part which generates a power for pressing the head slider 60 against the later-described hard disk 202 of the hard disk drive 201.

Further, as illustrated in FIG. 1 to FIG. 4, the flexure 6 has a flexure substrate 4, a base insulating layer 5, a connecting wiring 11 and thin-film piezoelectric material elements 12a, 12b. The flexure 6 has a structure which the base insulating layer 5 is formed on the flexure substrate 4, the connecting wiring 11 and thin-film piezoelectric material elements 12a, 12b are adhered on the base insulating layer 5. Further, the not illustrated protective insulating layer is formed so as to cover the connecting wiring 11 and thin-film piezoelectric material elements 12a, 12b.

The flexure 6 has a piezoelectric elements attached structure which thin-film piezoelectric material elements 12a, 12b are fixed on the surface of the base insulating layer 5 in addition to the connecting wiring 11 to become a structure with piezoelectric element.

Further, the flexure 6 has a gimbal part 10 on the tip side (load beam 3 side). A tongue part 19, which the head slider 60 is mounted, is secured on the gimbal part 10, and a plurality of connecting pads 20 are formed near an edge side than the tongue part 19. Connecting pads 20 are electrically connected to not-illustrated electrode pads of the head slider 60.

This flexure 6 expands or shrinks thin-film piezoelectric material elements 12a, 12b and expands or shrinks stainless part (referred to out trigger part) jut out outside of the tongue part 19. That makes a position of the head slider 60 move very slightly around not-illustrated dimple, and a position of the head slider 60 is controlled minutely.

The flexure substrate 4 is a substrate for supporting a whole of the flexure 6, and it is formed with stainless. Rear side of the flexure substrate 4 is fixed to the base plate 2 and the load beam 3 by weld. As illustrated in FIG. 1, the flexure substrate 4 has a center part 4a fixed to surfaces of the load beam 3 and the base plate 2, and a wiring part 4b extending to outside from the base plate 2.

The base insulating layer 5 covers s surface of the flexure substrate 4. The base insulating layer 5 is formed with for example polyimide, and it has a thickness of about 5 μm to 10 μm. Further, as illustrated in detail in FIG. 3, a part of the base insulating layer 5, disposed on the load beam 3, is divided two parts. One part of them is a first wiring part 5a, the other part of them is second wiring part 5b. The thin-film piezoelectric material element 12a and thin-film piezoelectric material element 12b are adhered on surfaces of each wiring part.

A plurality of connecting wirings 11 are formed on surfaces of each of the first wiring part 5a and the second wiring part 5b. Each connecting wiring 11 is formed with conductor such as copper or the like. One end parts of each connecting wiring 11 are connected to the thin-film piezoelectric material elements 12a, 12b or each connecting pad 20.

The not-illustrated protective insulating layer is formed with for example polyimide. The protective insulating layer has a thickness of about 1 μm to 2 μm, for example.

Further, a not illustrated thin-film magnetic head, which re records and reproduces data, is formed on the head slider 60. Furthermore, a plurality of not illustrated electrode pads are formed on the head slider 60, and each electrode pad is connected to the connecting pad 20.

(Structure of Thin-Film Piezoelectric Material Element)

Figure 5:
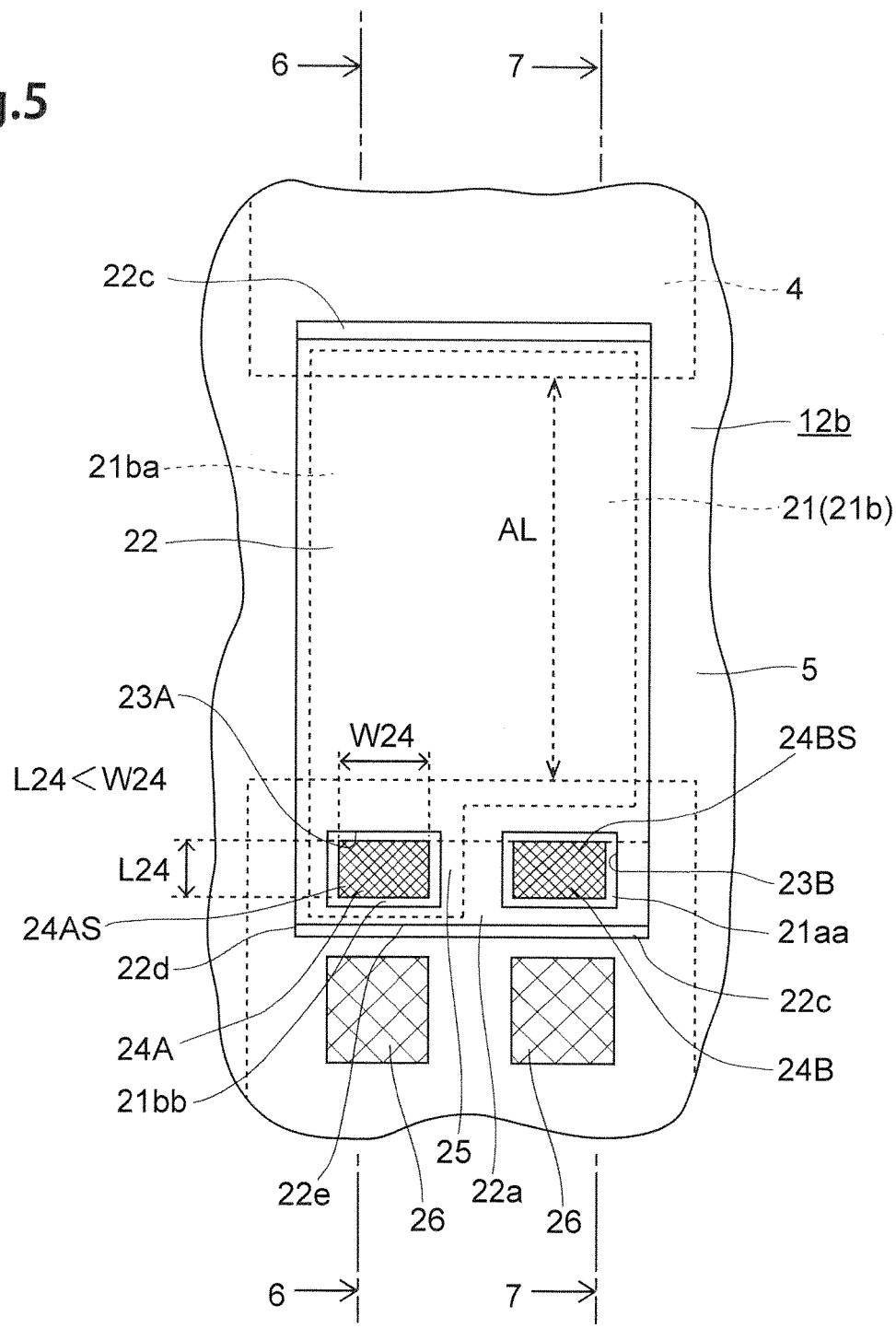
FIG. 5 is a plan view showing the thin-film piezoelectric material element and the peripheral part of the HGA in FIG. 1.
Figure 6:
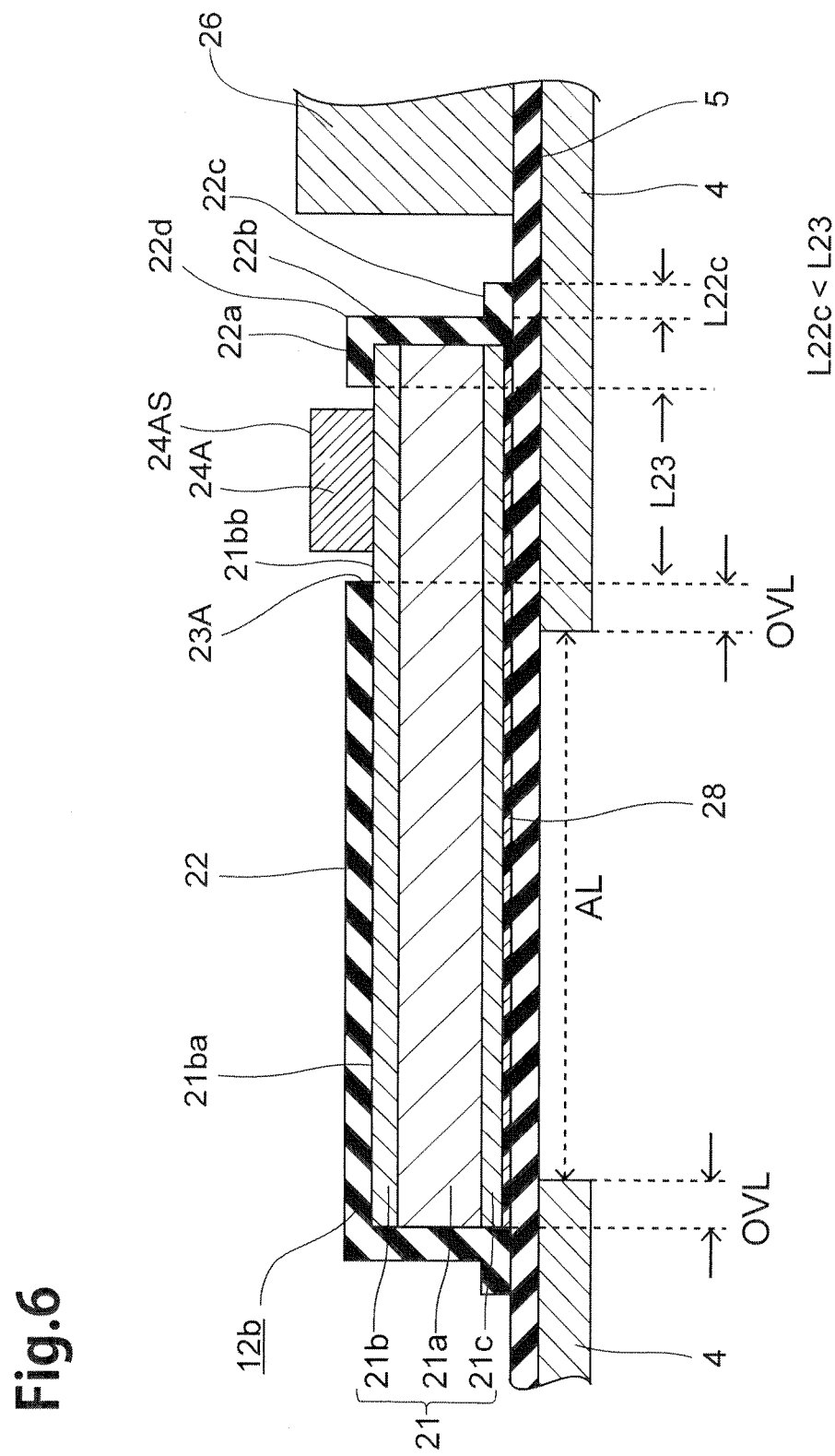
FIG. 6 is a sectional view taken along the line 6-6 in FIG. 5.
Figure 7:
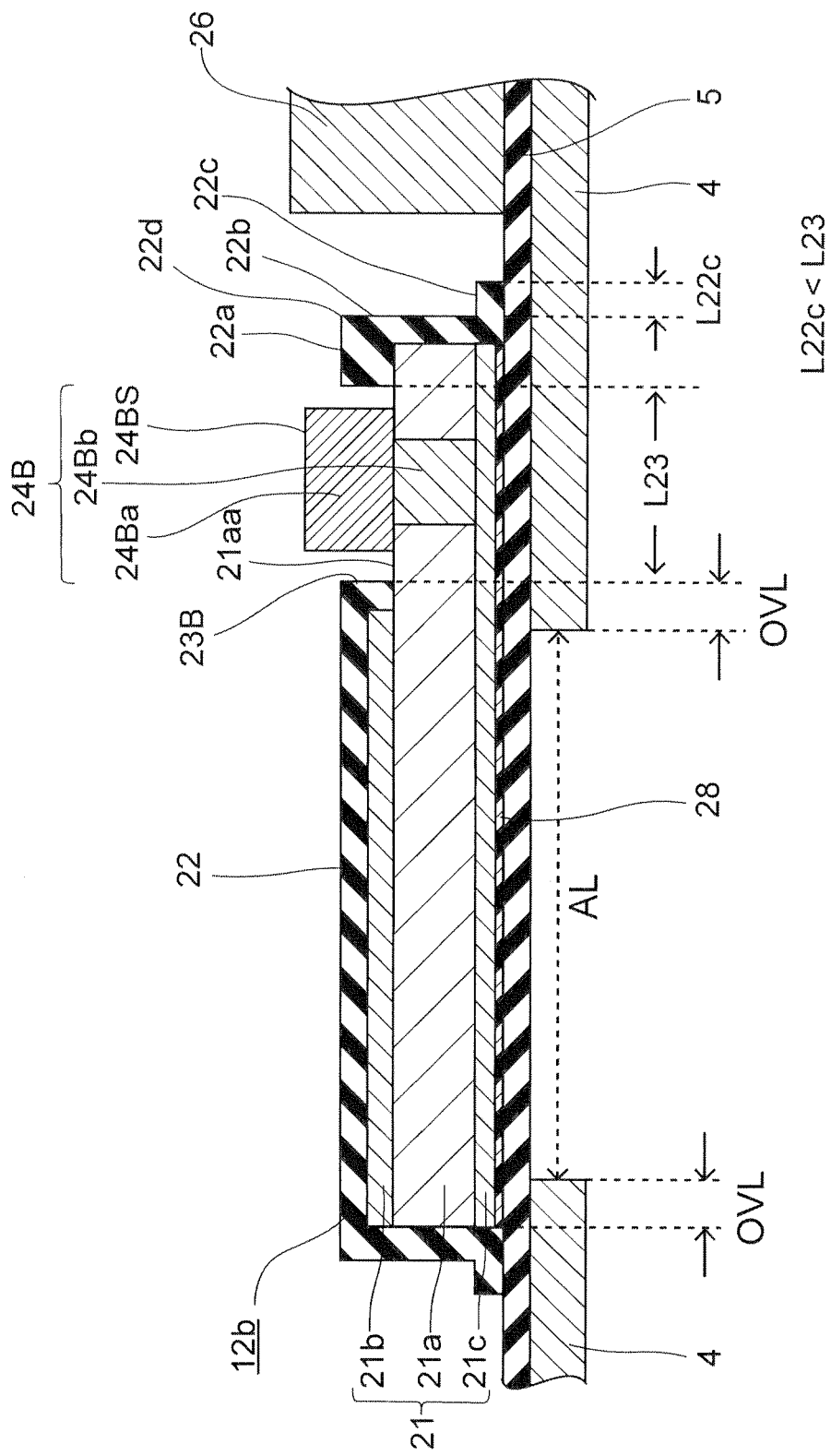
FIG. 7 is a sectional view taken along the line 7-7 in FIG. 5.
Figure 8:
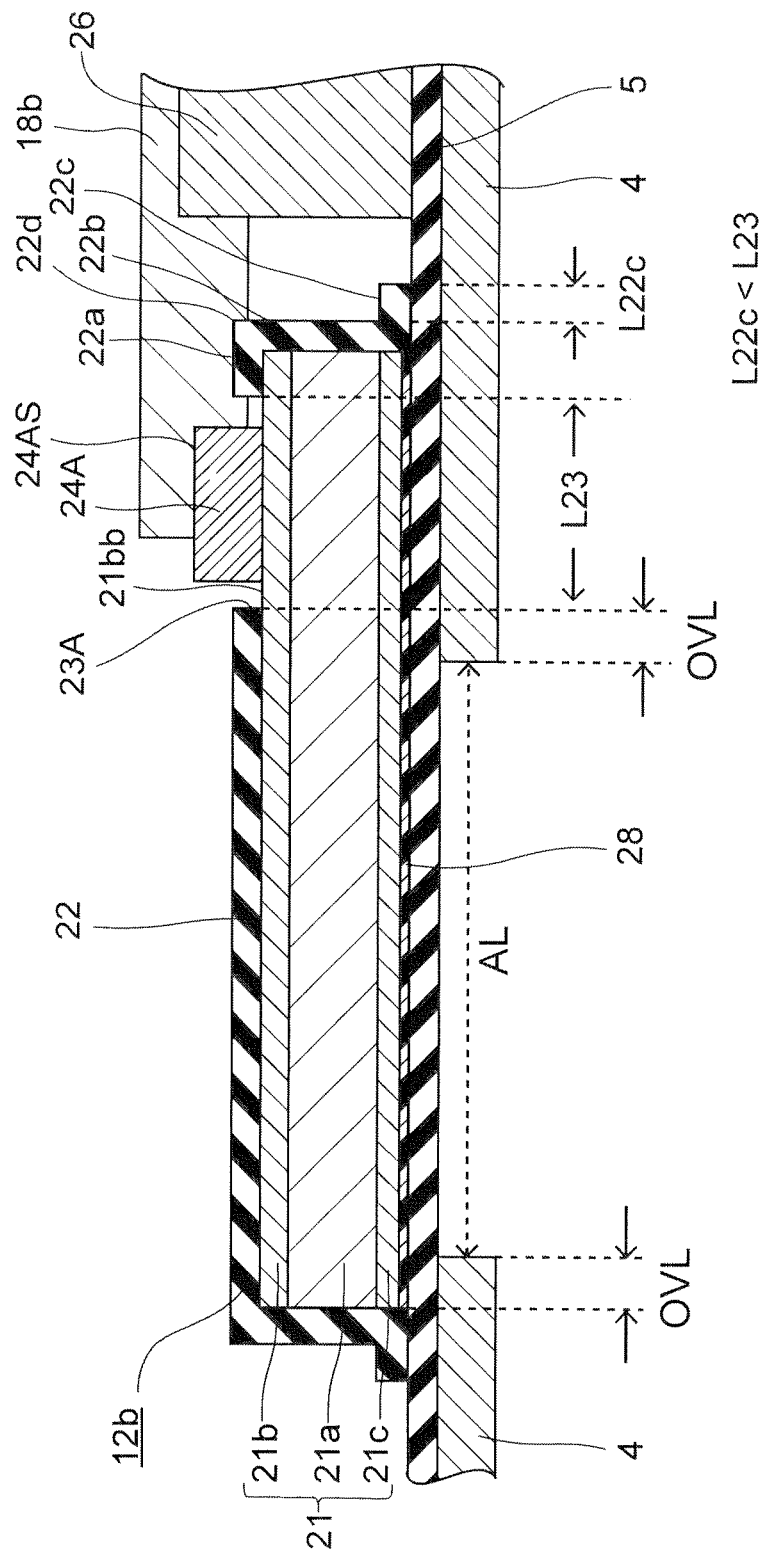
FIG. 8 is a sectional view, similar with FIG. 6, showing the thin-film piezoelectric material element connected to a suspension pad by a connecting electrode.

Subsequently, the structure of thin-film piezoelectric material element 12b will be explained with reference to FIG. 5 to FIG. 8. Here, FIG. 5 is a plan view showing the thin-film piezoelectric material element 12b and the peripheral part of the HGA 1. FIG. 6 is a sectional view taken along the line 6-6 in FIG. 5. FIG. 7 is a sectional view taken along the line 7-7 in FIG. 5. FIG. 8 is a sectional view, similar with FIG. 6, showing the thin-film piezoelectric material element 12b connected to a suspension pad 26 by a connecting electrode 18b. Note that the connecting electrode 18b is omitted in FIGS. 5-7 for convenience of illustration.

The thin-film piezoelectric material element 12b (similar to thin-film piezoelectric material element 12a), as illustrated in FIG. 5-FIG. 8, has a laminated structure part 21, a surface layer insulating film 22, an upper electrode pad 24A and a lower electrode pad 24B.

The thin-film piezoelectric material elements 12b, 12a are adhered to the surface of the base insulating layer 5 with epoxy resin. A resin layer 28 made of the epoxy resin is formed between the laminated structure part 21 and the base insulating layer 5.

The thin-film piezoelectric material elements 12b is formed with a rectangular shape in a plan view, as illustrated in detail in FIG. 5. A pad region 25 is secured at one side along with a long-side direction of the thin-film piezoelectric material elements 12b. The pad region 25 is a region from a boundary line 22e of a later-described top disposed part 22a and a side disposed part 22b to an upper electrode pad 24A and a lower electrode pad 24B. The upper through hole 23A, lower through hole 23B, the upper electrode pad 24A and lower electrode pad 24B are formed in the pad region 25.

Note that "upper" and "lower" in the present invention do not show necessarily upper side, lower side in a condition which the thin-film piezoelectric material element is adhered on the base insulating layer 5. These words are terms for reasons of convenience so as to distinguish two upper, lower electrode films 21b, 21c and so on opposing each other sandwiching the piezoelectric material film 21a their between. In the actual products, the upper electrode film 21b is sometimes disposed lower side, and the lower electrode film 21c is sometimes disposed upper side.

The laminated structure part 21 has the piezoelectric material film 21a, the lower electrode film 21c and the upper electrode film 21b. The piezoelectric material film 21a is laminated on the lower electrode film 21c, the upper electrode film 21b is laminated on the piezoelectric material film 21a. The laminated structure part 21 has laminated structure formed of the piezoelectric material film 21a, the lower electrode film 21c and the upper electrode film 21b.

The piezoelectric material film 21a is formed to be a thin-film shape using a piezoelectric material such as lead zirconate titanate ((Pb (Zr,Ti) $O_3$) which will also be referred to as "PZT" in the following) or the like. The piezoelectric material film 21a is formed by epitaxial growth and it has a thickness of about 2 μm to 5 μm. A piezoelectric ceramics (much of them are ferroelectric substance) such as barium titanate, lead titanate or the like, non-lead system piezoelectric ceramics not including titanium or lead are able to be used for the piezoelectric material film 21a instead of using PZT.

The lower electrode film 21c is a thin-film (thickness about 100 nm) made of metal element which has Pt (it may include Au, Ag, Pd, Ir, Ru, Cu, in addition to Pt) as main ingredient, it is formed on the base insulating layer 5. A crystal structure of the lower electrode film 21 is a face-centered cubic structure.

Note that a lower adhesive film is preferably formed between the lower electrode film 21c and the piezoelectric material film 21a, not illustrated though. The lower adhesive film is a thin-film (thickness about 20 nm) made of conductive material formed by epitaxial growth such as $SrRuO_3$ (referred to also as SRO) or the like, it is able to be formed on top surface, of the lower electrode film 21c, of the piezoelectric material film 21a side. The piezoelectric material film 21a is able to be formed on the lower adhesive film.

The upper electrode film 21b is a polycrystal thin-film (thickness about 50 nm) with metal element which has Pt (it may include Au, Ag, Pd, Ir, Rh, Ni, Pb, Ru, Cu, in addition to Pt) as main ingredient, it is formed on the piezoelectric material film 21a. The upper electrode film 21b has a figure which the part under the lower through hole 23B and the peripheral part are lacked (hereinafter, referred also to as "partial lacked figure), so as not to be in touch with later-described lower electrode pad 24B.

Further, not illustrated though, an upper adhesive film is preferably formed between the piezoelectric material film 21a and the upper electrode film 21b. The upper adhesive film is a thin-film (thickness about 35 nm) made of amorphous conductive material such as $SrRuO_3$ or the like, and it is formed on the piezoelectric material film 21a.

The surface layer insulating film 22 is disposed on the top surface and side surfaces of four direction of the laminated structure part 21, and it is formed so as to cover the top surface and side surfaces of four direction of the laminated structure part 21. The surface layer insulating film 22 is formed with insulating material such as polyimide or the like. The surface layer insulating film 22 has a top disposed part 22a, a side disposed part 22b, and a long-side disposed part 22c.

The top disposed part 22a is a part disposed on the top surface of laminated structure part 21. The top disposed part 22a is formed directly on the top surface 21ba of the upper electrode film 21b. One end side of the long-side direction of the top disposed part 22a is assigned to the pad region 25.

The side disposed part 22b is a part disposed on a long-side side surfaces of the laminated structure part 21. The long-side side surfaces are a pair of side surfaces along the long-side direction of the thin-film piezoelectric material element 12b among four side surfaces. The side disposed parts 22b are formed directly on the long-side side surfaces of the laminated structure part 21. The long-side disposed parts 22c are connected to the lower end part of the side disposed parts 22b.

The long-side disposed parts 22c is a part projected outside from the side disposed parts 22b along the long-side direction. The long-side disposed parts 22c is formed directly on the base insulating layer 5. A length of the long-side disposed parts 22c along the long-side direction (hereinafter, referred also to as "long-side length") L22c is shorter than later-described long-side length L23 (L22c<L23). Therefore, in the thin-film piezoelectric material element 12b, the side disposed parts 22b are brought near to later-described suspension pad 26 though, even so the long-side disposed parts 22c is not in contact with the suspension pad 26.

The upper through hole 23A is formed in the pad region 25 of the top disposed part 22a. The upper through hole 23A penetrates the top disposed part 22a, as illustrated in FIG. 6. The top surface of the upper electrode film 21b is exposed, inside the upper through hole 23A, as an inside exposed surface 21bb having rectangular shape in a plan view.

The lower through hole 23B is also formed in the pad region 25 of the top disposed part 22a. The lower through hole 23B penetrates the top disposed part 22a similar with the upper through hole 23A, as illustrated in FIG. 7. Because the upper electrode film 21b is formed with above-described partial lacked figure, surface of the piezoelectric material film 21a is exposed, inside the lower through hole 23B, as an inside exposed surface 21aa having rectangular shape in a plan view.

The upper electrode pad 24A is formed inside the upper through hole 23A. The upper electrode pad 24A is formed in a rectangular parallelepiped shape. The upper electrode pad 24A is in directly contact with the inside exposed surface 21bb which is a surface of the upper electrode film 21b. The upper electrode pad 24A is entirely disposed inside an outer edge part 22d (outermost peripheral part of the top disposed part 22a). Further, the upper electrode pad 24A is formed without contact with the side disposed parts 22b.

Then, the upper electrode pad 24A has a long-pad length L24 and a short-pad length W24. The long-pad length L24 is a length of the upper electrode pad 24A along with long-side direction of the thin-film piezoelectric material element 12b. The short-pad length W24 is a length of the upper electrode pad 24A along with short-side direction of the thin-film piezoelectric material element 12b. Further, the long-pad length L24 is shorter than the short-pad length W24 (L24<W24).

Further, the upper electrode pad 24A has an outer end surface 24AS having rectangular shape in a plan view. A fine mesh pattern is drawn in the outer end surface 24AS, as illustrated in FIG. 5. The outer end surface 24AS is formed outside the top disposed part 22a, as illustrated in FIG. 6. The outer end surface 24AS is entirely flat. The outer end surface 24AS is disposed inside the outer edge part 22d, and disposed inside the upper through hole 23A. Note that rough mesh pattern is drawn in the suspension pad 26, in FIG. 5.

Furthermore, the upper electrode pad 24A is formed in a size smaller than the inside exposed surface 21bb. A gap is secured between the upper electrode pad 24A and inside side surface of the upper through hole 23A. And, a part of the inside exposed surface 21bb is a non pad-contact surface being out of contact with the upper electrode pad 24A. The non pad-contact surface is formed in a circular shape which surrounds periphery of the upper electrode pad 24A.

The lower electrode pad 24B has an upper pad part 24Ba and a lower pad part 24Bb, as illustrated in FIG. 7. The upper pad part 24Ba is connected with the top surface of the lower pad part 24Bb. The upper pad part 24Ba and the lower pad part 24Bb are formed in the rectangular parallelepiped shape respectively.

The upper pad part 24Ba is formed inside the lower through hole 23B. The upper pad part 24Ba is entirely disposed inside the outer edge part 22d similar with the upper electrode pad 24A. Further, the upper pad part 24Ba is formed without contact with the side disposed parts 22b.

The upper pad part 24Ba has the same long-pad length L24 and short-pad length W24 as the upper electrode pad 24A. Further, the upper pad part 24Ba has the same outer end surface 24BS having rectangular shape in a plan view as the upper electrode pad 24A. As illustrated in FIG. 5, the same fine mesh pattern is also drawn in the outer end surface 24BS as the outer end surface 24AS. The outer end surface 24BS is entirely flat. The outer end surface 24BS is disposed entirely inside the outer edge part 22d, and disposed inside the upper through hole 23A.

Furthermore, the upper pad part 24Ba is formed in a size smaller than the inside exposed surface 21aa similar with the upper electrode pad 24A, and the gap is also secured between the upper pad part 24Ba and inside side surface of the lower through hole 23B. And, a part of the inside exposed surface 21aa is formed the non pad-contact surface being out of contact with the upper pad part 24Ba. The non pad-contact surface is formed in a circular shape which surrounds periphery of the upper pad part 24Ba.

The lower pad part 24Bb penetrates the piezoelectric material film 21a. The lower pad part 24Bb is embedded in a hole part of the piezoelectric material film 21a. The top surface of the lower pad part 24Bb is exposed in the top surface of the piezoelectric material film 21a, the upper pad part 24Ba is connected to the top surface of the lower pad part 24Bb. The lower pad part 24Bb is directly contact with the top surface of the lower electrode film 21c.

The thin-film piezoelectric material elements 12b, having the above-described structure, is connected to suspension pads 26, 26 with connecting electrode 18b (referred to also connecting pad, can be formed with solder, for example). In this case, connecting electrodes 18b, 18b connect outer end surfaces 24AS, 24BS of the upper, lower electrode pad 24A, 24B to suspension pads 26, 26, respectively.

Note that connecting wiring 11 and thin-film piezoelectric material elements 12b, 12a are shown in FIG. 2 to FIG. 4, for illustration of convenience, they are not exposed in the surface of the flexure 6, because they are cover with not-illustrated protective insulating layer.

(Operation and Effect of Thin-Film Piezoelectric Material Element)

Subsequently, operation and effect of the thin-film piezoelectric material element 12b having the above-described structure will be explained with comparing the thin-film piezoelectric material element 12b according to the embodiment of the present invention with a conventional thin-film piezoelectric material element 112b.

Figure 24:
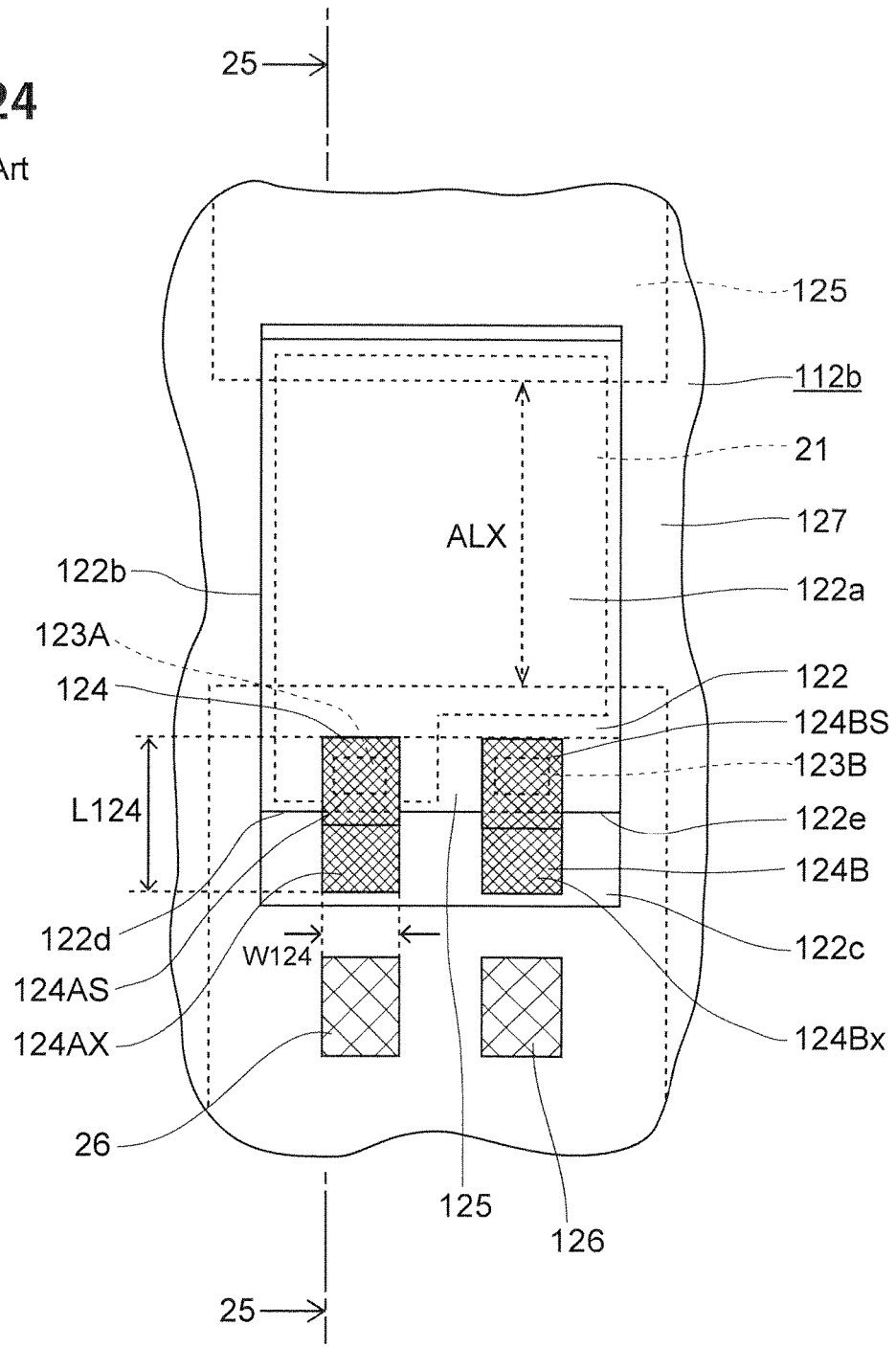
FIG. 24 is a plan view showing the thin-film piezoelectric material element and the peripheral part in the conventional HGA.
Figure 25:
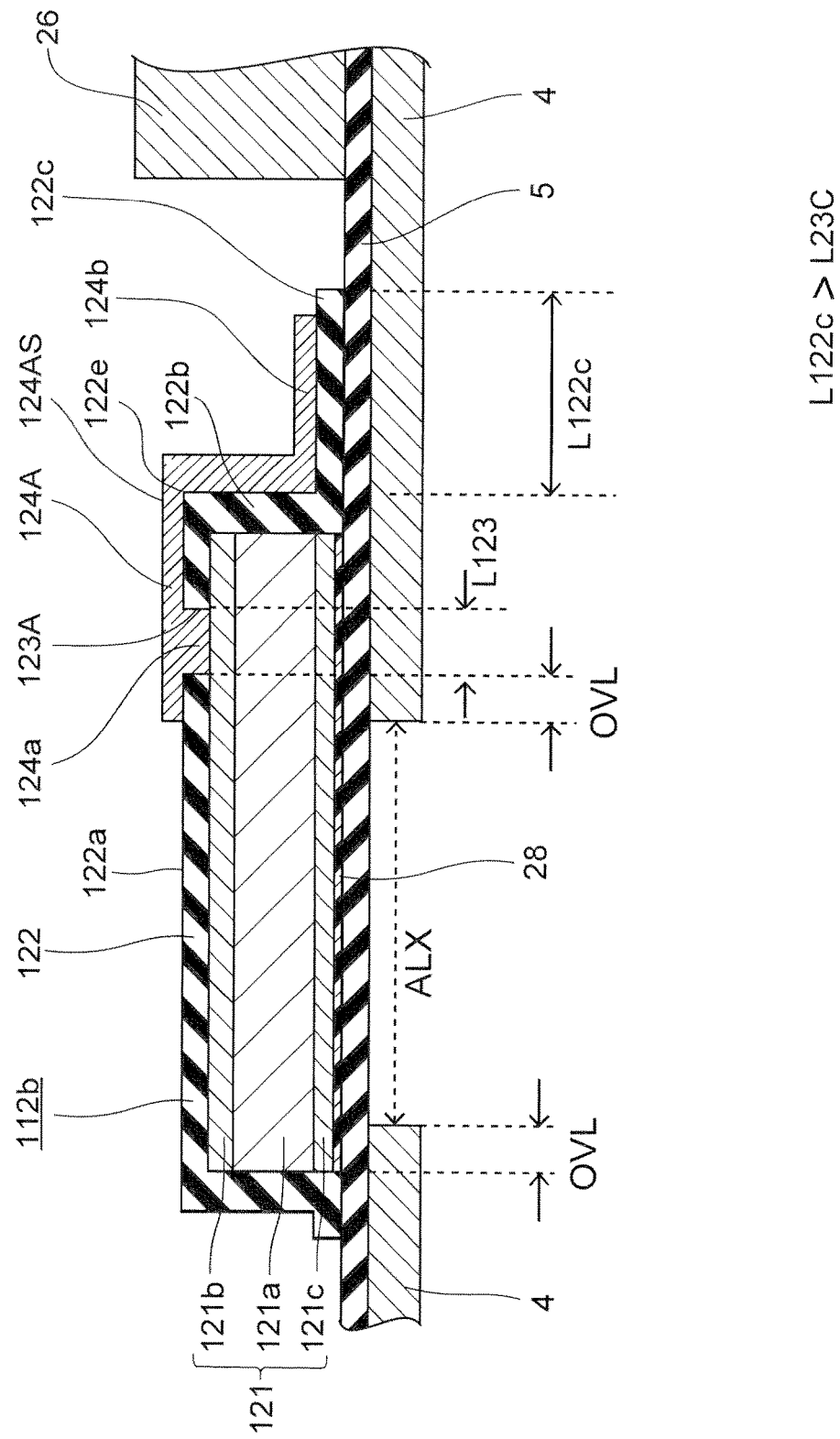
FIG. 25 is a sectional view taken along the line 25-25 in FIG. 24.
Figure 26:
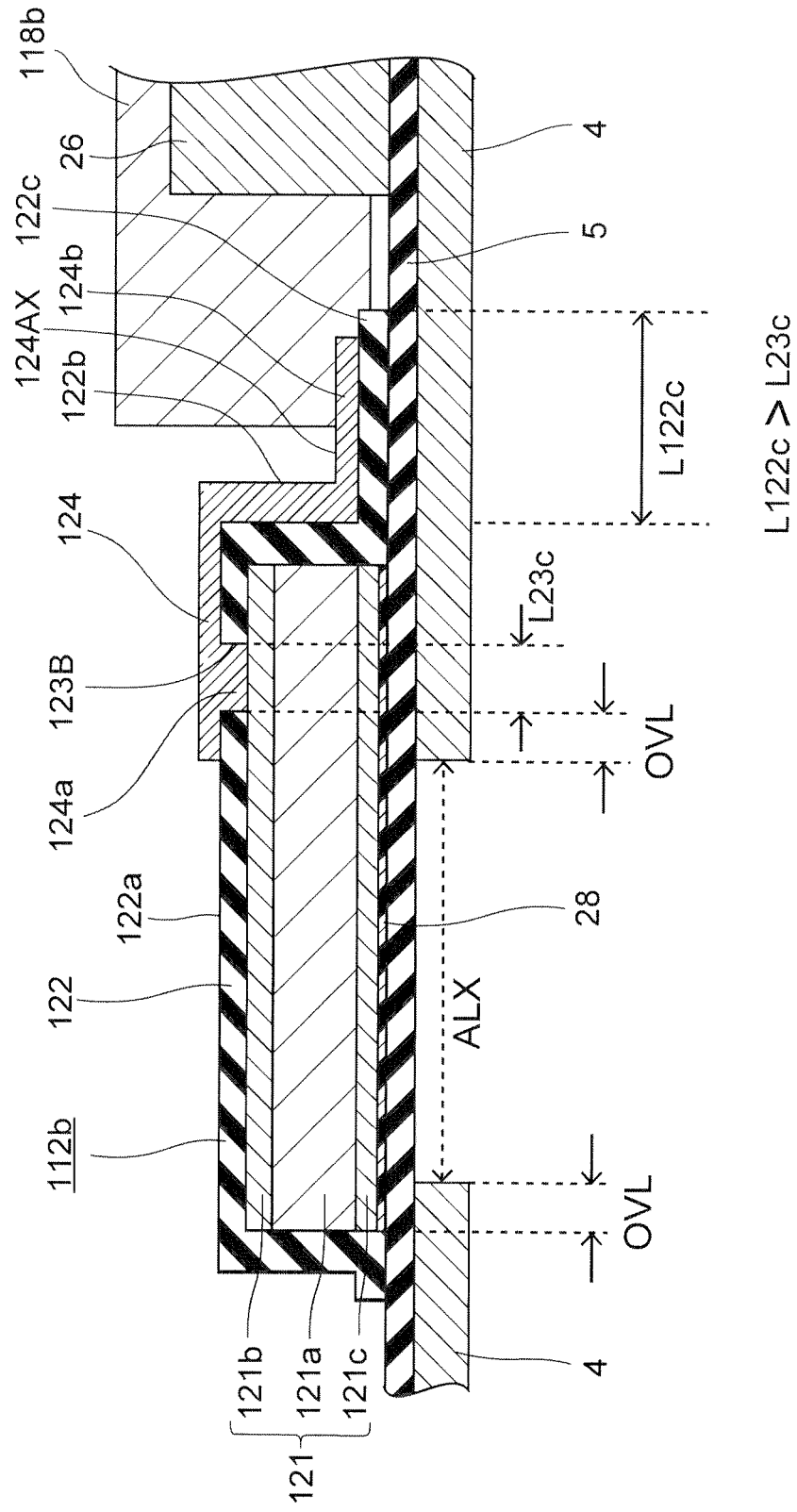
FIG. 26 is a sectional view, similar with FIG. 25, showing the thin-film piezoelectric material element in FIG. 24 connected to the suspension pad by the connecting electrode.

First of all, the conventional thin-film piezoelectric material element 112b will be explained as follows. The conventional thin-film piezoelectric material element 112b is shown in FIG. 24, FIG. 25, FIG. 26. Here, FIG. 24 is a plan view showing the thin-film piezoelectric material element 112b and the peripheral part in the conventional HGA. FIG. 25 is a sectional view taken along the line 25-25 in FIG. 24. FIG. 26 is a sectional view, similar with FIG. 25, showing the thin-film piezoelectric material element 112b connected to the suspension pad 26 by the connecting electrode 118b.

The conventional thin-film piezoelectric material element 112b has a laminated structure part 121, a surface layer insulating film 122, an upper electrode pad 124A and a lower electrode pad 124B. The thin-film piezoelectric material elements 112b is adhered to the surface of the base insulating layer 5 with epoxy resin similar with the thin-film piezoelectric material element 12b. Therefore, a resin layer 28 made of the epoxy resin is formed between the laminated structure part 121 and the base insulating layer 5.

The thin-film piezoelectric material elements 112b is formed with the same rectangular shape with the thin-film piezoelectric material elements 12b, a pad region 125 is secured in one side along with a long-side direction of the thin-film piezoelectric material elements 112b. The pad region 125 is a region from a boundary line 122e of a later-described top disposed part 122a and a side disposed part 122b of the surface layer insulating film 122 to upper, lower electrode pads 124A, 124B.

The laminated structure part 121 has the upper electrode film 121b, the piezoelectric material film 121a and the lower electrode film 121c. The laminated structure part 121 has the same three-layers structure with the laminated structure part 21. However, the active length ALX is shorter than the active length AL of the thin-film piezoelectric material elements 12b.

The surface layer insulating film 122 is different in that it has a top disposed part 122a, a side disposed part 122b, and a long-side disposed part 122c as compared with the surface layer insulating film 22. The top disposed part 122a is a part disposed on the top surface of laminated structure part 121, the side disposed part 122b is a part disposed on long-side side surfaces of the laminated structure part 121, and the long-side disposed parts 122c is a part projected outside from the side disposed parts 122b along the long-side direction. The long-side length L122c is longer than later-described long-side length L123 (L122c>L123). The surface layer insulating film 122 differs from the surface layer insulating film 22 in this point greatly.

The upper, lower through holes 123A, 123B are different in that parts of upper, lower electrode pads 124A, 124B are formed inside them respectively without gap, as compared with the upper, lower through holes 23A, 23B. Further, the upper, lower through holes 123A, 123B are different in that the upper, lower through holes 123A, 123B are smaller than later-described outer end surfaces 124AS, 124BS of the upper, lower electrode pad 124A, 124B, as compared with the upper, lower through holes 23A, 23B.

The upper, lower electrode pads 124A, 124B are directly in contact with surfaces of the upper, lower electrode films 121b, 121c respectively as the upper, lower electrode pads 24A, 24B are directly in contact with surfaces of the upper, lower electrode films 21b, 21c respectively. However, the upper, lower electrode pads 124A, 124B and the upper, lower electrode pads 24A, 24B are different in the following A) to F).

A) Parts of the upper, lower electrode pads 124A, 124B are disposed outside an outer edge part 122d of the top disposed part 122a. However, the upper, lower electrode pad 24A, 24B are entirely disposed inside the outer edge part 22d.

B) The upper, lower electrode pads 124A, 124B have parts being in contact with the side disposed parts 122b respectively. However, the upper, lower electrode pad 24A, 24B are formed without being contact with the side disposed parts 22b, and they do not have parts being in contact with the side disposed parts 22b.

C) Long-pad length L124 of the upper, lower electrode pads 124A, 124B is longer than the short-pad length W124 of the upper, lower electrode pads 124A, 124B. However, long-pad length L24 of the upper, lower electrode pads 24A, 24B is shorter than the short-pad length W24 of the upper, lower electrode pads 24A, 24B (L24<W24).

D) Outer end surfaces 124AS, 124BS have parts formed outside the outer edge part 122d, and they have parts formed outside than the upper, lower through holes 123A, 123B. However, outer end surfaces 24AS, 24BS are entirely disposed inside the outer edge part 22d, and they are disposed inside the upper, lower through holes 23A, 23B.

E) The upper, lower electrode pads 124A, 124B are formed in size larger than the upper, lower through holes 123A, 123B. However, the upper, lower electrode pad 24A, 24B are formed in size smaller than the upper, lower through holes 23A, 23B.

F) The upper, lower electrode pads 124A, 124B are in contact with the exposed surface of the upper, lower electrode film 121b, 121c inside the through holes 123A, 123B. However, the upper, lower electrode pad 24A, 24B are in contact with only a part of the inside exposed surface 21bb, 21aa.

As described above, the thin-film piezoelectric material elements 12b is different in structures of the upper, lower through holes 23A, 23B, the upper, lower electrode pad 24A, 24B and the surface layer insulating film 22 respectively.

By the way, the active length AL is decided by the length of long-side direction of the part which existing part in the pad region 25 and OVL in FIG. 6 are removed from the laminated structure part 121. The OVL is corresponding to the part which the flexure substrate 4, the laminated structure part 21 and top disposed part 22a of the surface layer insulating film 22 are overlaid. There is no great difference between the laminated structure part 21 and the laminated structure part 121 about length of part existing in the pad region 25,125 and length of OVL. However, respective active length AL and ALX are different as follows.

In the conventional thin-film piezoelectric material elements 112b, the upper, lower electrode pad 124A, 124B are extended from the through holes 123A, 123B to upper side of the long-side disposed parts 122c through the side disposed parts 122b. And as illustrated in FIG. 26, part, of the upper, lower electrode pad 124A, 124B, on the long-side disposed parts 122c (projected part 124AX, 124BX) are connected to the suspension pad 26.

On the other hand, in the thin-film piezoelectric material elements 12b, the upper, lower through holes 23A, 23B, the upper, lower electrode pads 24A, 24B and the surface layer insulating film 22 are provided, parts connected with the suspension pad 26 are the upper, lower electrode pads 24A, 24B.

Figure 23:
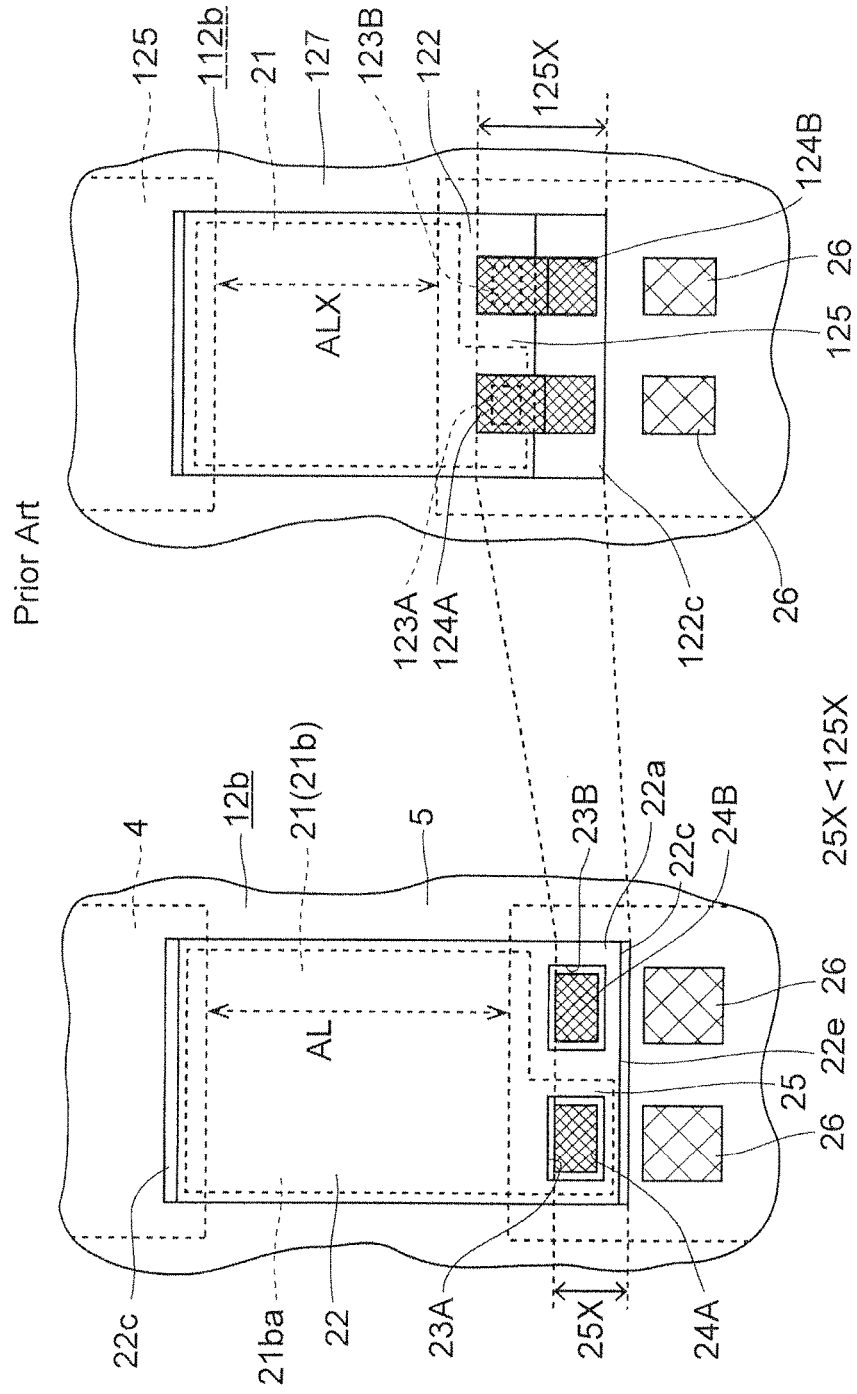
FIG. 23 (a) is a plan view showing the thin-film piezoelectric material elements according to the embodiment of the present embodiment, FIG. 23 (b) is a plan view showing the conventional thin-film piezoelectric material element.

Then, the upper, lower electrode pads 24A, 24B are disposed inside the outer edge part 22d, and they are out of contact with the side disposed parts 22b, they are entirely disposed inside the top disposed part 22a. Further, as illustrated in FIG. 23 (a), FIG. 23 (b), the length 25X, of the pad region 25 and long-side disposed parts 22c along the long-side direction of the thin-film piezoelectric material elements 12b, are greatly shortened as compared with the length 125X of the pad region 125 and long-side disposed parts 122c, and lengths along the long-side direction of the upper, lower electrode pads 24A, 24B are also greatly shortened as compared with conventional one.

Therefore, a space along the long-side direction of the thin-film piezoelectric material elements 12b is larger than a space along the long-side direction of the thin-film piezoelectric material elements 112b, thereby the length of the laminated structure part 21 along the long-side direction can be made longer than the length of the laminated structure part 121 along the long-side direction.

Accordingly, in the thin-film piezoelectric material elements 12b, the active length is extended than the conventional thin-film piezoelectric material elements 112b, the active length AL can be made longer than the active length ALX. Therefore, the stroke of the thin-film piezoelectric material elements 12b is increased than the stroke of the thin-film piezoelectric material elements 112b.

Further, concerning the upper, lower electrode pad 24A, 24B, the long-pad lengths L24 of them are shorter than the short-pad lengths W24. Because this is effective for shortening the space of the thin-film piezoelectric material elements 12b along the long-side direction, the space of the thin-film piezoelectric material elements 12b along the long-side direction is further extended, thereby the active length is further extended.

Further, the outer end surfaces 24AS, 24BS of the upper, lower electrode pads 24A, 24B are entirely flat, and they do not have bending parts like the upper, lower electrode pads 124A, 124B. If the bending parts exist like the upper, lower electrode pads 124A, 124B, existence of the parts on the side disposed part 122b bring difficulty about approach of the thin-film piezoelectric material elements 112b to the suspension pad 26, thereby space extension of the thin-film piezoelectric material elements 112b along the long-side direction is difficult.

However, in case of the thin-film piezoelectric material elements 12b, the outer end surfaces 24AS, 24BS are entirely flat, and upper, lower electrode pads 24A, 24B do not have bending parts. Therefore, the thin-film piezoelectric material elements 12b is able to be approached, space extension of the thin-film piezoelectric material elements 12b along the long-side direction is able to be executed.

Further, in case of the thin-film piezoelectric material elements 12b, long-side length L22c of the long-side disposed parts 22c is shorter than the long-side length L23 of the upper through hole 23A. Therefore, the thin-film piezoelectric material elements 12b is able to be more approached, the length of the thin-film piezoelectric material elements 12b is able to be extended. This brings further space extension of the thin-film piezoelectric material elements 12b along the long-side direction.

Figure 21:
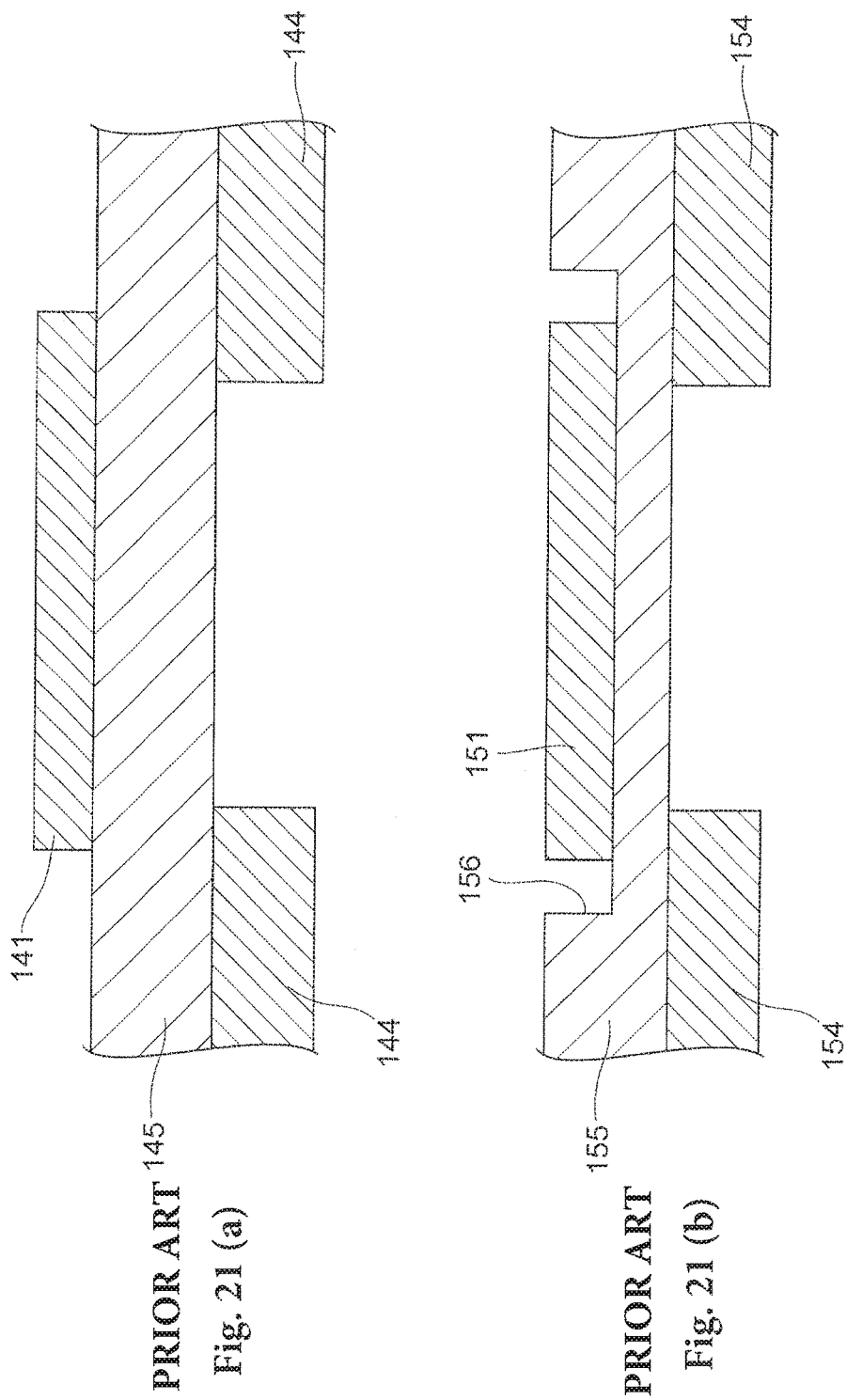
FIG. 21 (a) is a sectional view showing a principal part of the conventional thin-film piezoelectric material element, FIG. 21 (b) is a sectional view showing a principal part of another conventional thin-film piezoelectric material element.

On the other hand, as illustrated in FIG. 21(a), the conventional thin-film piezoelectric material elements 190, having a piezoelectric material film 141, flat flexure substrate 144 and a base insulating layer 145 has a problem in which the stroke escape in a bending direction. Therefore, as illustrated in FIG. 21(b), the thin-film piezoelectric material elements 191, having the base insulating layer 155 instead of the base insulating layer 145, is conventionally known. A cavity 156 is formed in the base insulating layer 155.

Figure 22:
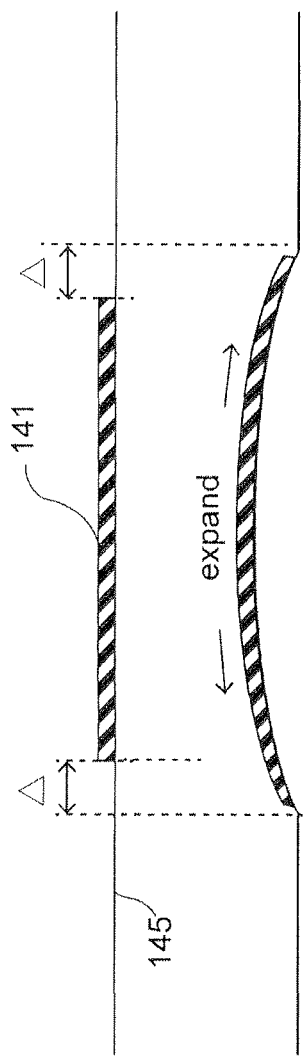
FIG. 22 (a) is a view schematically showing stroke of the thin-film piezoelectric material element in FIG. 21 (a), FIG. 22 (b) is a view schematically showing stroke of the thin-film piezoelectric material element in FIG. 21 (b)
Figure 22:
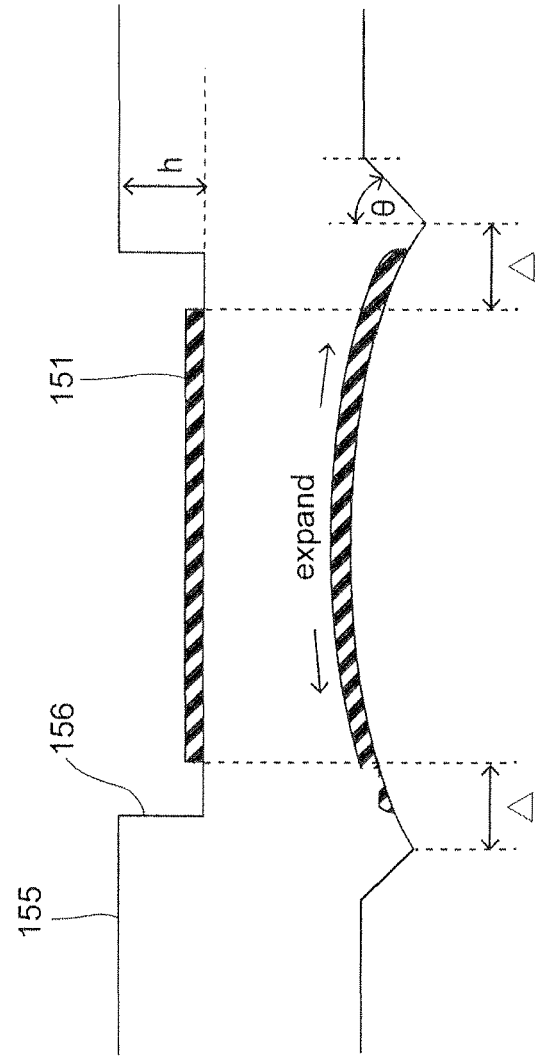

Then, as illustrated in FIG. 22(a), the stroke of the thin-film piezoelectric material elements 190 is the size that subtract reduced amount with bending of the piezoelectric material film 141 from 2Δ (two times of Δ) when the piezoelectric material film 141 is flat. Further, as illustrated in FIG. 22(a), the stroke of the thin-film piezoelectric material elements 191 is the size that subtract reduced amount with bending of the piezoelectric material film 141 from 2Δ+2h Sin θ, when the piezoelectric material film 141 is flat.

The thin-film piezoelectric material elements 191 has an effect by improvement of escaping stroke in bending direction, but length of the piezoelectric material film 141 is the same with the thin-film piezoelectric material elements 191, so there is no difference about active length.

On the other hand, in case of the thin-film piezoelectric material elements 12b according to the present invention, the long-side length of the laminated structure part 21 is longer than the conventional one, so active length become longer than the conventional one. Accordingly, active length is extended than the conventional one, the stroke is also increased than the conventional one.

Modified Example 1

Figure 9:
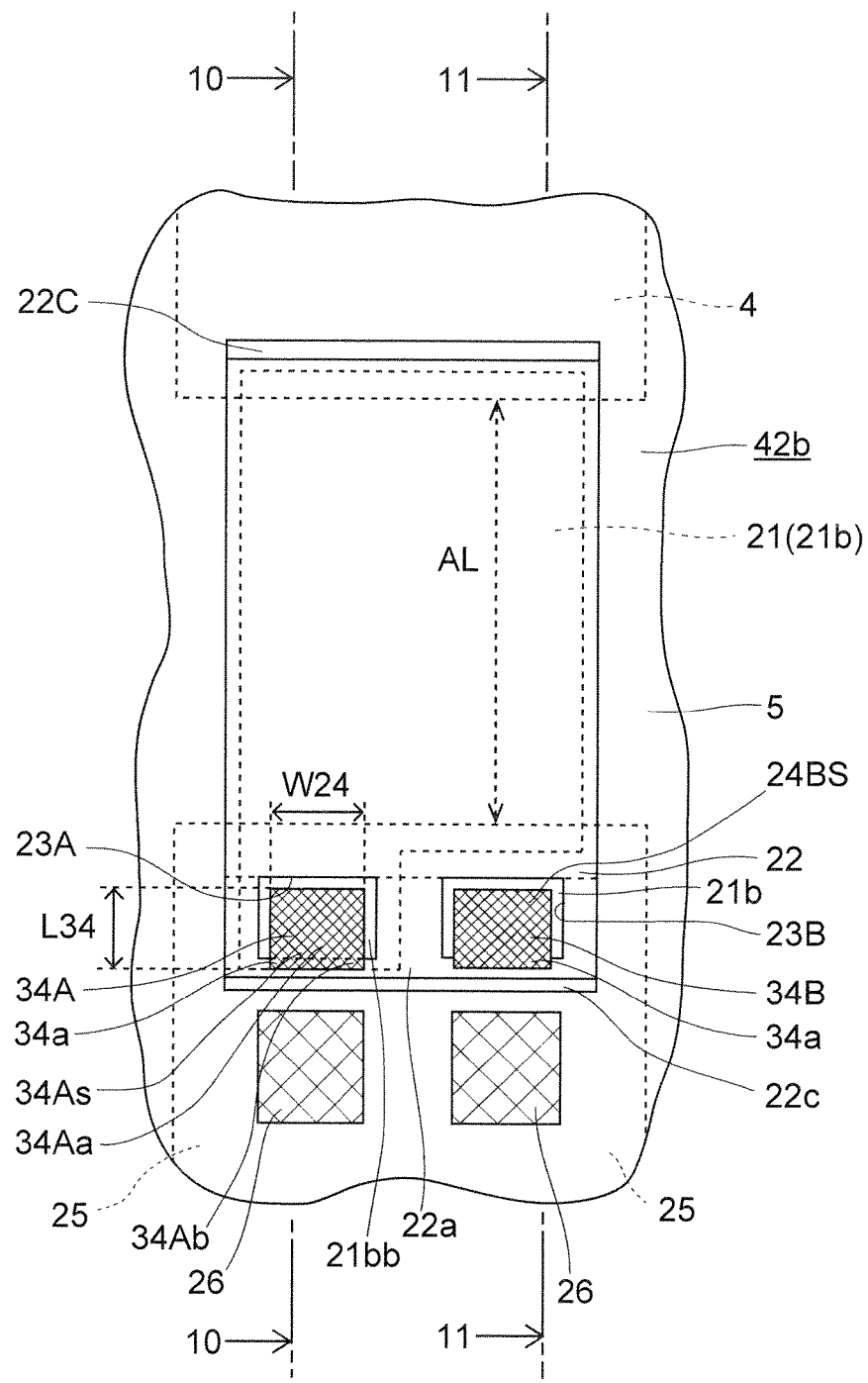
FIG. 9 is a plan view, similar with FIG. 5, showing the thin-film piezoelectric material element and the peripheral part according to modified example.
Figure 10:
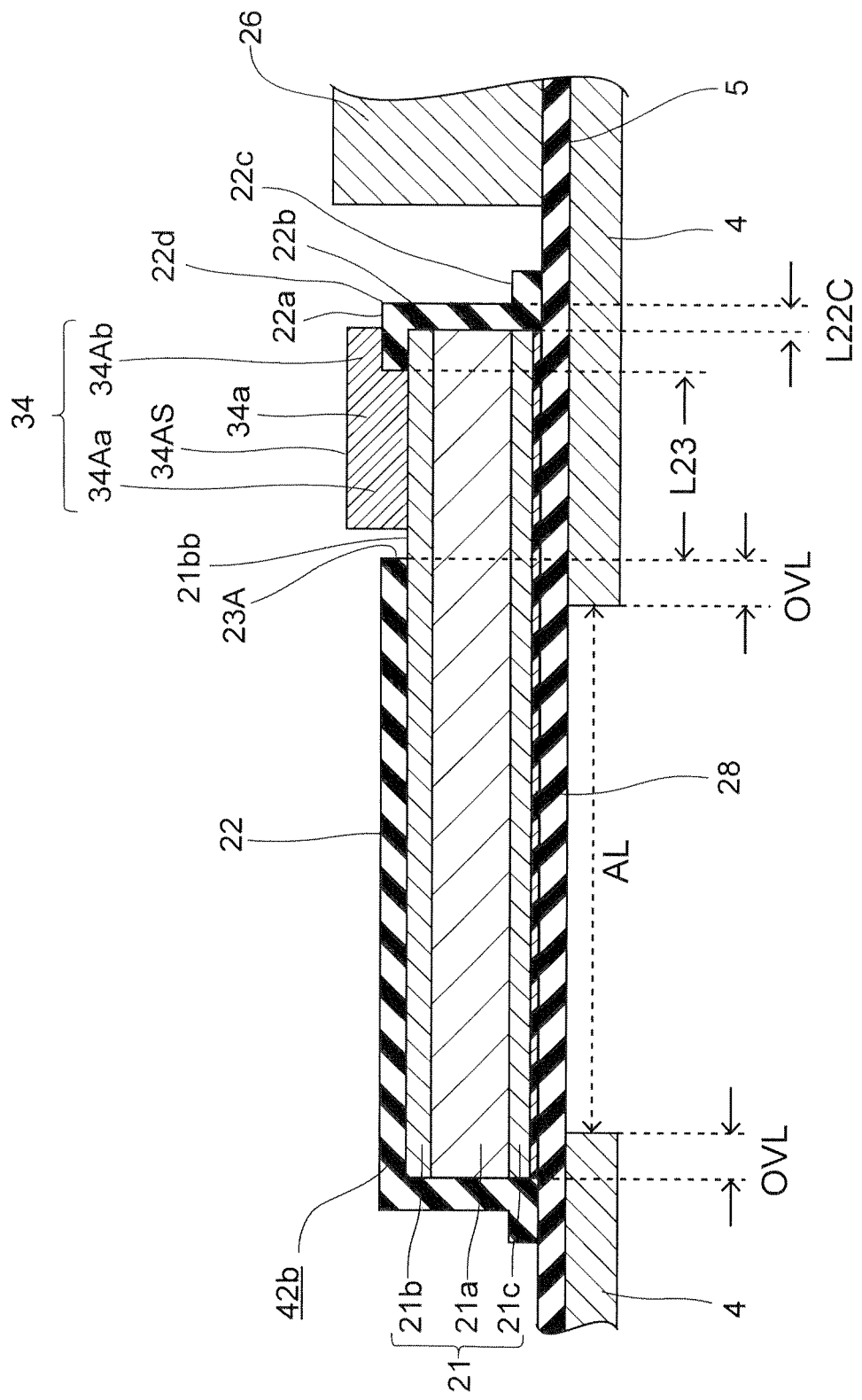
FIG. 10 is a sectional view taken along the line 10-10 in FIG. 9.
Figure 11:
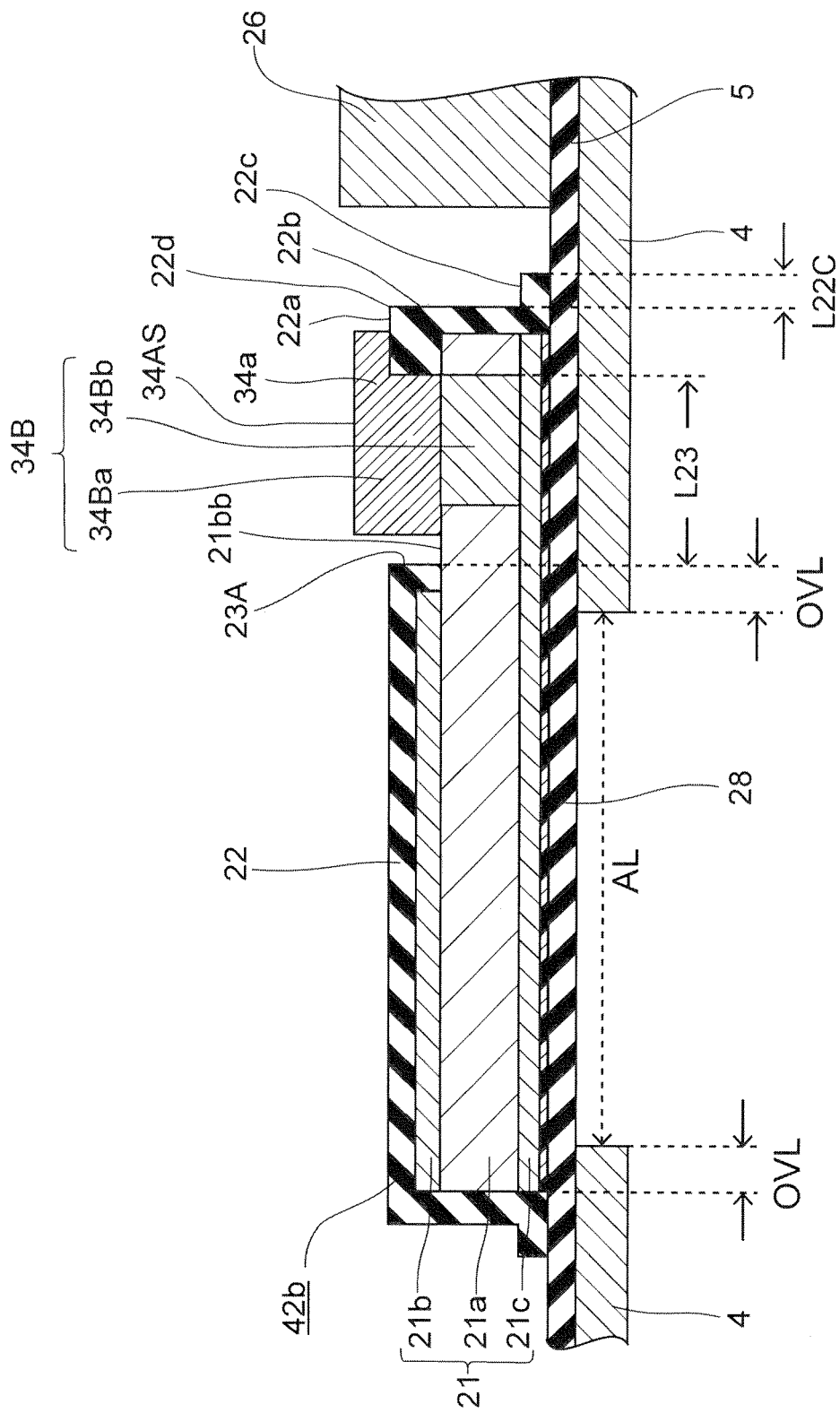
FIG. 11 is a sectional view taken along the line 11-11 in FIG. 9.
Figure 12:
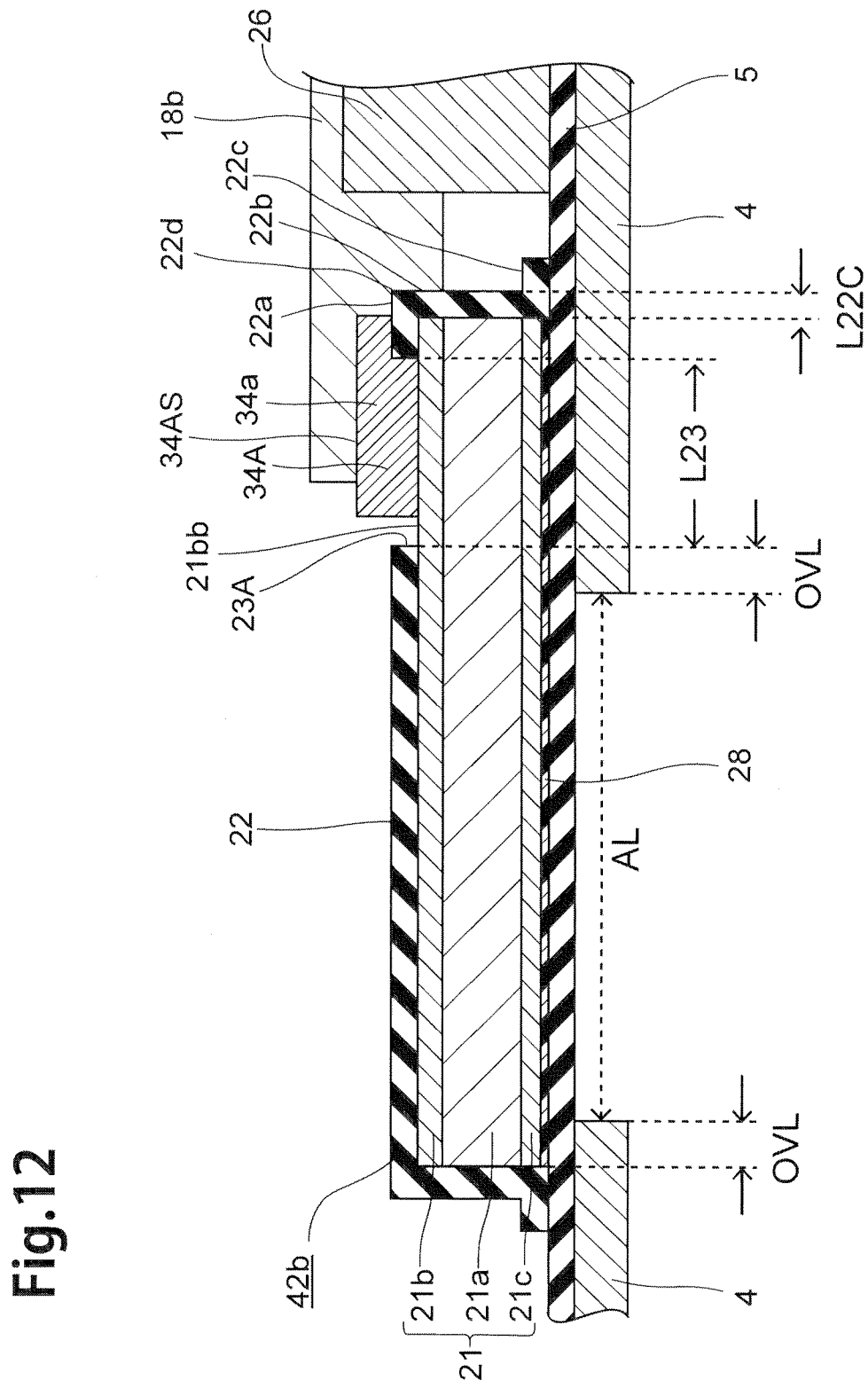
FIG. 12 is a sectional view, similar with FIG. 6, showing the thin-film piezoelectric material element, according to the modified example, connected to the suspension pad by the connecting electrode.

Subsequently, the thin-film piezoelectric material element 42b according to the modified example 1 will be explained with reference to FIG. 9 to FIG. 12. Here, FIG. 9 is a plan view, similar with FIG. 5, showing the thin-film piezoelectric material element 42b and the peripheral part according to the modified example 1. FIG. 10 is a sectional view taken along the line 10-10 in FIG. 9, FIG. 11 is a sectional view taken along the line 11-11 in FIG. 9. FIG. 12 is a sectional view, similar with FIG. 10, showing the thin-film piezoelectric material element 42b, connected to the suspension pad 26 by the connecting electrode 18b. Note that the connecting electrode 18b is omitted in FIGS. 9-11 for convenience of illustration.

The thin-film piezoelectric material element 42b are different in that it has upper, lower electrode pads 34A, 34B instead of upper, lower electrode pads 24A, 24B, as compared with the thin-film piezoelectric material element 12b.

The upper electrode pad 34A have an inside pad part 34Aa and outside pad part 34Ab. The inside pad part 34Aa and outside pad part 34Ab are unified.

The inside pad part 34Aa is formed inside the upper through hole 23A, but a part of the inside pad part 34Aa is in contact with the upper through hole 23A. The inside pad part 34Aa is formed in the rectangular parallelepiped shape. The inside pad part 34Aa is directly in contact with the inside exposed surface 21bb, and disposed entirely inside the outer edge part 22d. Further, the inside pad part 34Aa is formed without contact with the side disposed parts 22b.

The outside pad part 34Ab is a part which extends outside than the upper through hole 23A (referred to also extended part). The outside pad part 34Ab is disposed in the closer position than the inside pad part 34Aa to the suspension pads 26. The outside pad part 34Ab is formed on the surface layer insulating film 22. The outside pad part 34Ab is disposed entirely inside the outer edge part 22d. The outside pad part 34Ab is formed without contact with the side disposed parts 22b.

The upper electrode pad 34A has a long-pad length L34 and the short-pad length W24, it is preferable that the long-pad length L34 is less than the short-pad length W24 (L34≤W24).

Further, the upper electrode pad 34A has an outer end surface 34AS having rectangular shape in a plan view. As illustrated in FIG. 9, the fine mesh pattern is drawn in the outer end surface 34AS. As illustrated in FIG. 10, the outer end surface 34AS is a part formed outside the top disposed part 22a. The outer end surface 34AS is entirely flat. A part of the outer end surface 34AS is disposed outside the upper through hole 23A, but the outer end surface 34AS is entirely inside the outer edge part 22d.

As illustrated in FIG. 11, the lower electrode pad 34B have an upper pad part 34Ba and lower pad part 34Bb. The upper pad part 34Ba is connected to the top surface of the lower pad part 34Bb.

The upper pad part 34Ba have an inside pad part and outside pad part, similar with the upper electrode pad 34A, the inside pad part and outside pad part are unified. The upper pad part 34Ba is disposed entirely inside the outer edge part 22d, similar with the upper electrode pad 34A. Further, the upper pad part 34Ba is formed without contact with the side disposed parts 22b.

The lower pad part 34Bb penetrates the piezoelectric material film 21a. The lower pad part 34Bb is in directly contact with the top surface of the lower electrode film 21c.

As illustrated in FIG. 12, the thin-film piezoelectric material elements 42b, having the above-described structure, is connected to suspension pads 26, 26 with connecting electrode 18b. In this case, connecting electrodes 18b, 18b connect outer end surfaces 34AS, 34BS of the upper, lower electrode pads 34A, 34B to suspension pads 26, 26, respectively.

The above-described thin-film piezoelectric material elements 42b has the same the upper, lower through holes 23A, 23B with the thin-film piezoelectric material elements 12b and further it has the upper, lower electrode pads 34A, 34B, and the surface layer insulating film 22.

Parts of the upper, lower electrode pads 34A, 34B are extended outside the upper, lower through holes 23A, 23B unlike the upper, lower electrode pads 24A, 24B, but the upper, lower electrode pads 34A, 34B are entirely not in contact with the side disposed parts 22, and the upper, lower electrode pads 34A, 34B are disposed entirely inside the outer edge part 22d. Therefore, in case of the thin-film piezoelectric material elements 42b, a space is also able to be secured along the long-side direction, similar with the thin-film piezoelectric material elements 12b, length of the laminated structure part 21 along the long-side direction can be made longer than a length of the laminated structure part 121 along the long-side direction.

Therefore, the active length of the thin-film piezoelectric material elements 42b is also extended than the active length of the thin-film piezoelectric material elements 112b, the active length AL is able to be extended than the conventional active length ALX. Accordingly, the stroke of the thin-film piezoelectric material elements 42b is increased than the stroke of the thin-film piezoelectric material elements 112b.

Further, when the long-pad length L34 of the upper, lower electrode pads 34A, 34B is shorter than the short-pad length W24, the space of the thin-film piezoelectric material elements 42b along the long-side direction is further extended, thereby the active length is further extended.

Further, the outer end surfaces 34AS, 34BS of the upper, lower electrode pads 34A, 34B are flat, and they do not have bending parts. Therefore, the thin-film piezoelectric material elements 42b is able to be approached to the suspension pad 26, further space extension of the thin-film piezoelectric material elements 42b along the long-side direction is able to be executed.

Modified Example 2

Figure 13:
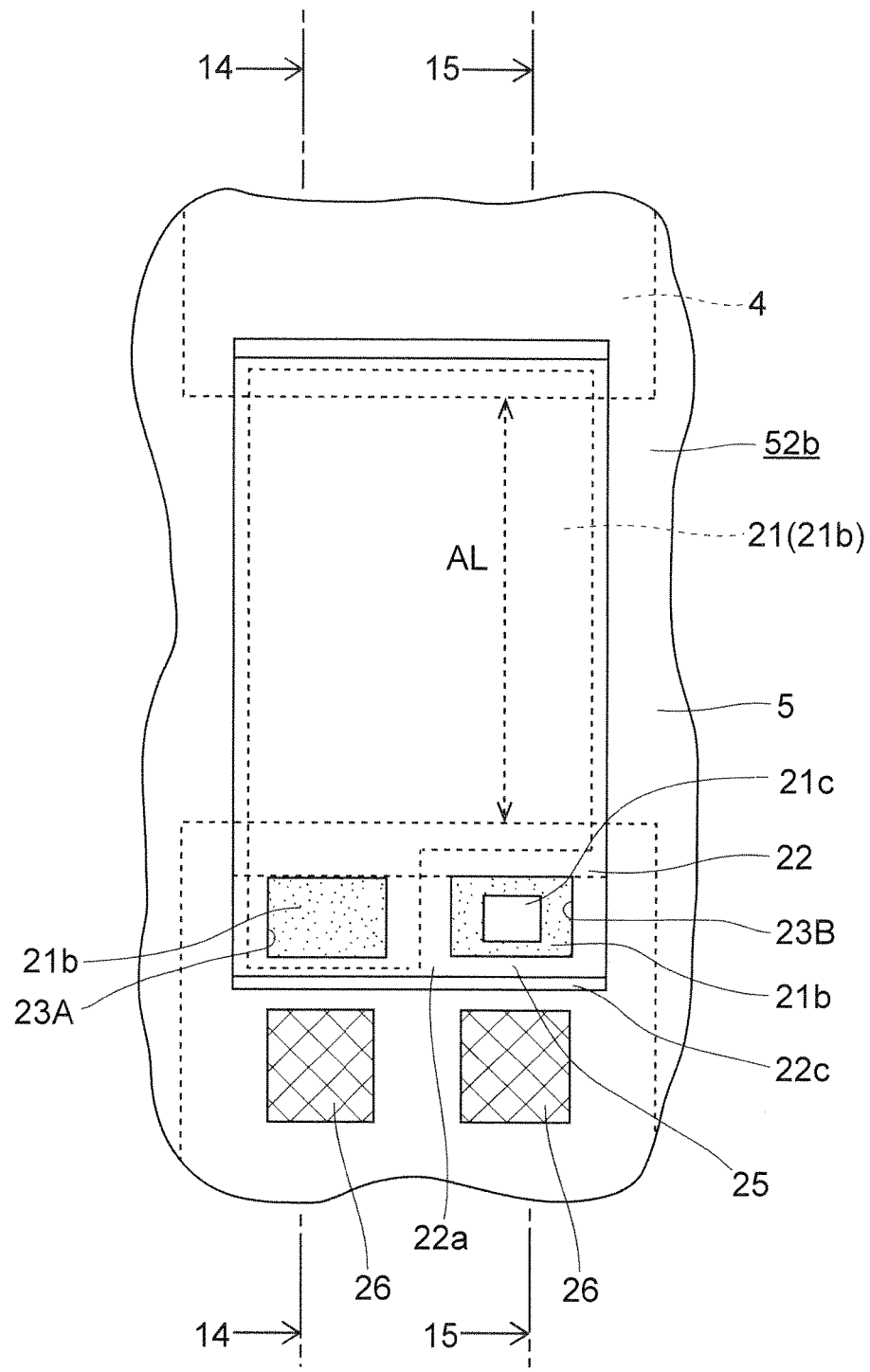
FIG. 13 is a plan view, similar with FIG. 5, showing the thin-film piezoelectric material element and the peripheral part according to another modified example.
Figure 14:
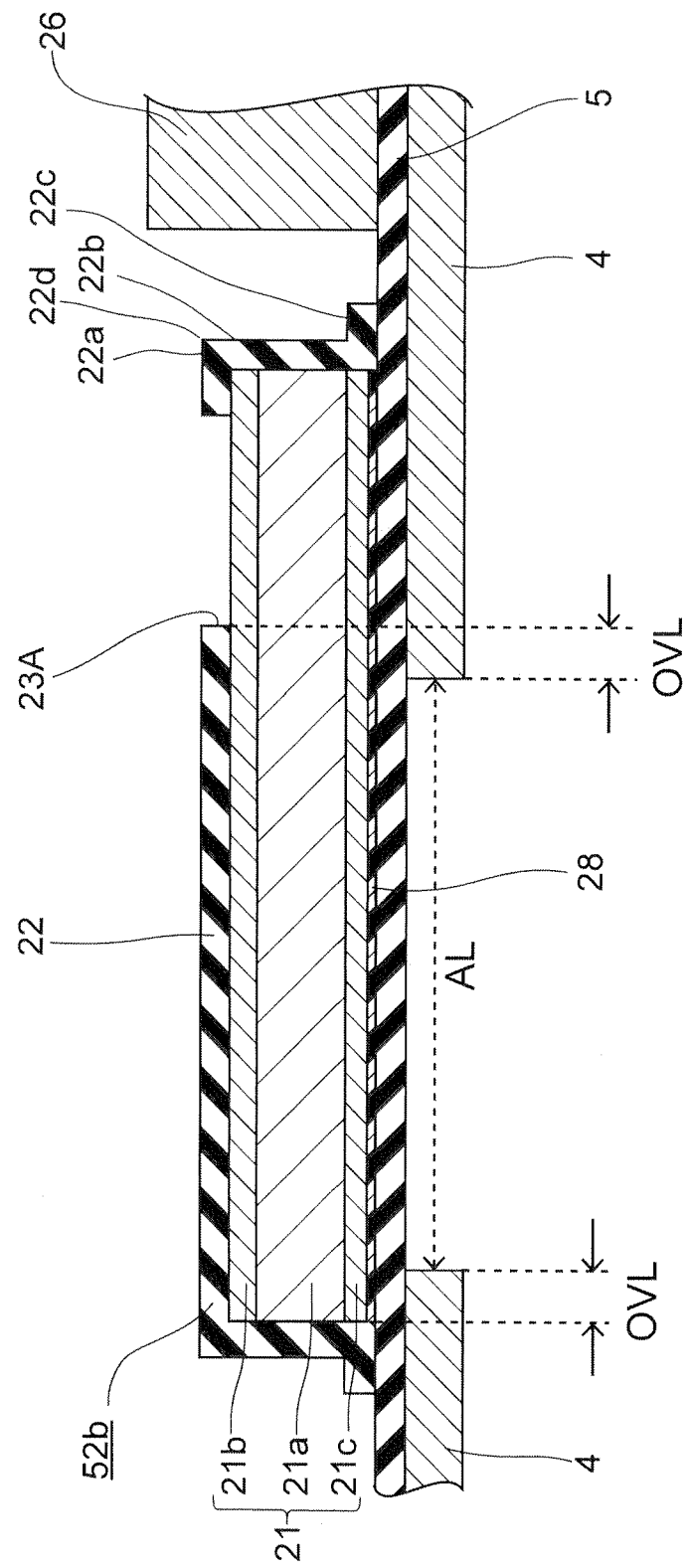
FIG. 14 is a sectional view taken along the line 14-14 in FIG. 13.
Figure 15:
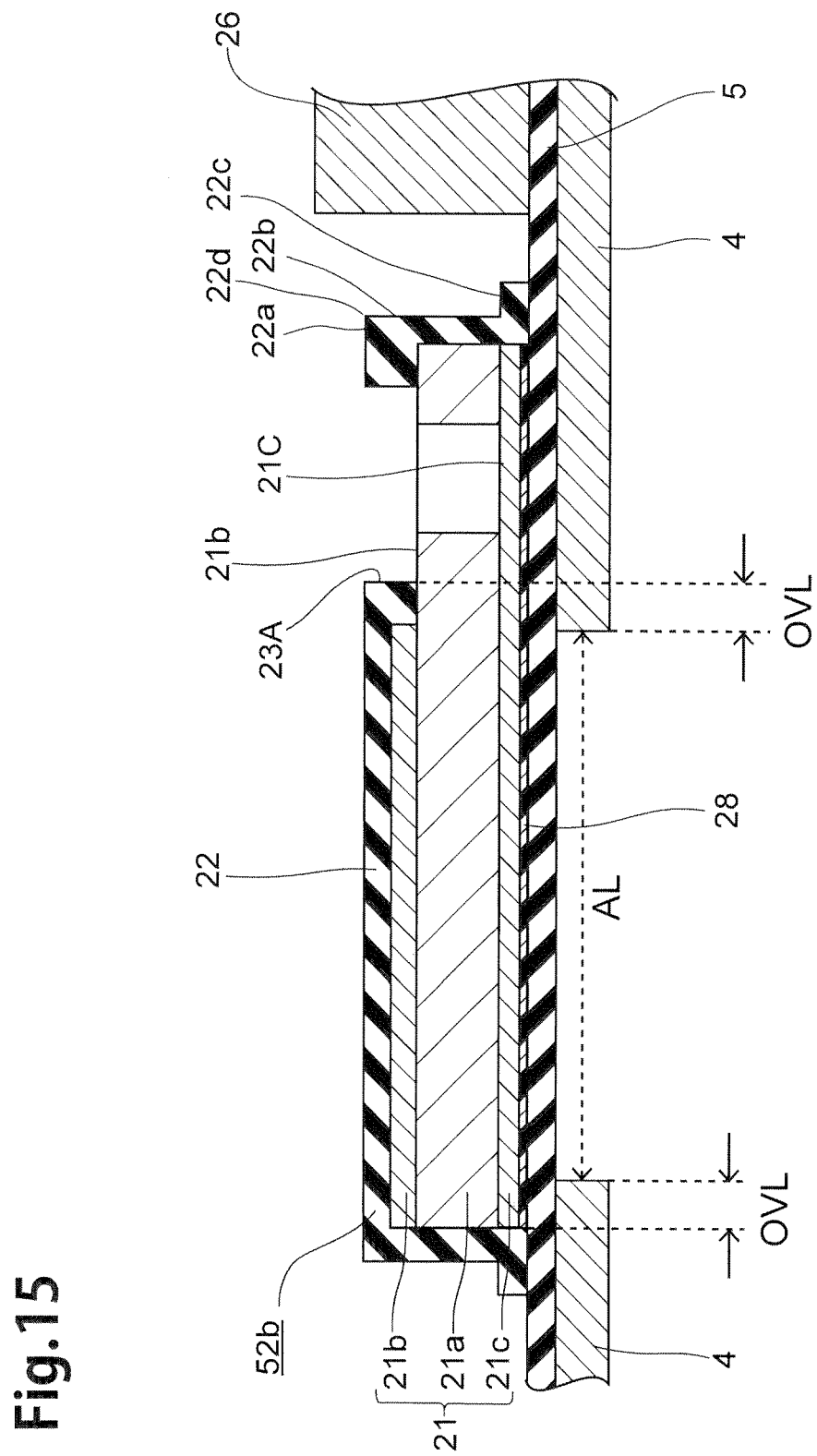
FIG. 15 is a sectional view taken along the line 15-15 in FIG. 13.
Figure 16:
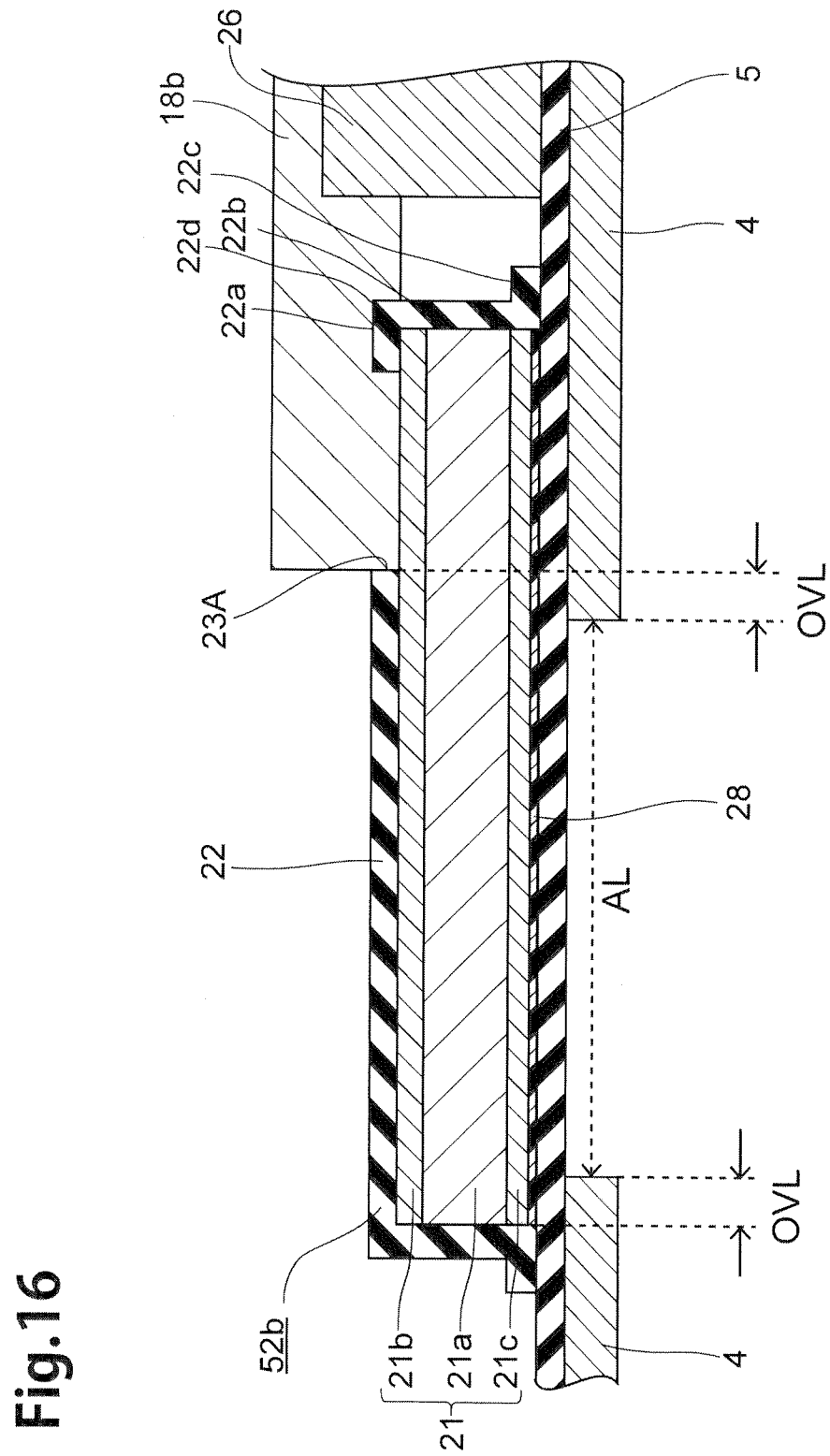
FIG. 16 is a sectional view, similar with FIG. 14, showing the thin-film piezoelectric material element, according to another modified example, connected to the suspension pad by the connecting electrode.

Subsequently, the thin-film piezoelectric material element 52b according to the modified example 2 will be explained with reference to FIG. 13 to FIG. 16. Here, FIG. 13 is a plan view, similar with FIG. 5, showing the thin-film piezoelectric material element 52b and the peripheral part according to the modified example 2. FIG. 14 is a sectional view taken along the line 14-14 in FIG. 13, FIG. 15 is a sectional view taken along the line 15-15 in FIG. 13. FIG. 16 is a sectional view, similar with FIG. 14, showing the thin-film piezoelectric material element 52b, connected to the suspension pad 26 by the connecting electrode 18b. Note that the connecting electrode 18b is omitted in FIGS. 13-15 for convenience of illustration.

The thin-film piezoelectric material element 52b are different in that it does not have upper, lower electrode pads 24A, 24B, as compared with the thin-film piezoelectric material element 12b.

However, the connecting electrode 18b, 18b are formed directly on the upper, lower electrode film 21b, 21c. Thereby, as illustrated in FIG. 16, the thin-film piezoelectric material element 52b is connected to the suspension pad 26.

The thin-film piezoelectric material element 52b has the same surface layer insulating film 22 as the thin-film piezoelectric material element 12b. Because, the surface layer insulating film 22 has the long-side disposed parts 22c, the long-side length L22c is shorter than the long-side length L23, the thin-film piezoelectric material elements 52b is able to be approached so as not to be in touch with the suspension pad 26.

Therefore, the length of the thin-film piezoelectric material element 52b is able to be extended, the space along the long-side direction of the thin-film piezoelectric material element 52b is able to be extended, the active length is extended.

Modified Example 3

Figure 17:
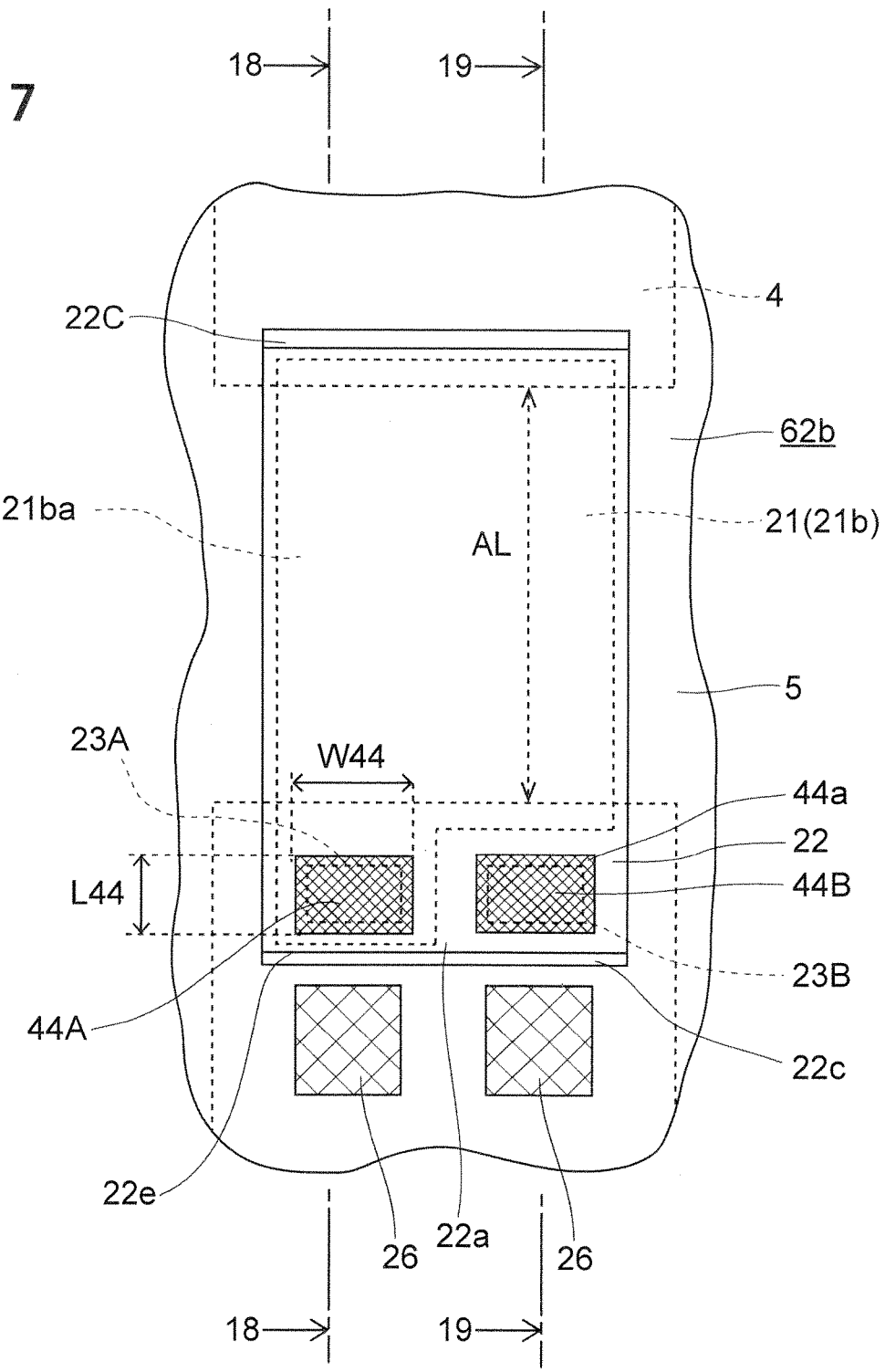
FIG. 17 is a plan view, similar with FIG. 5, showing the thin-film piezoelectric material element and the peripheral part according to still another modified example.
Figure 18:
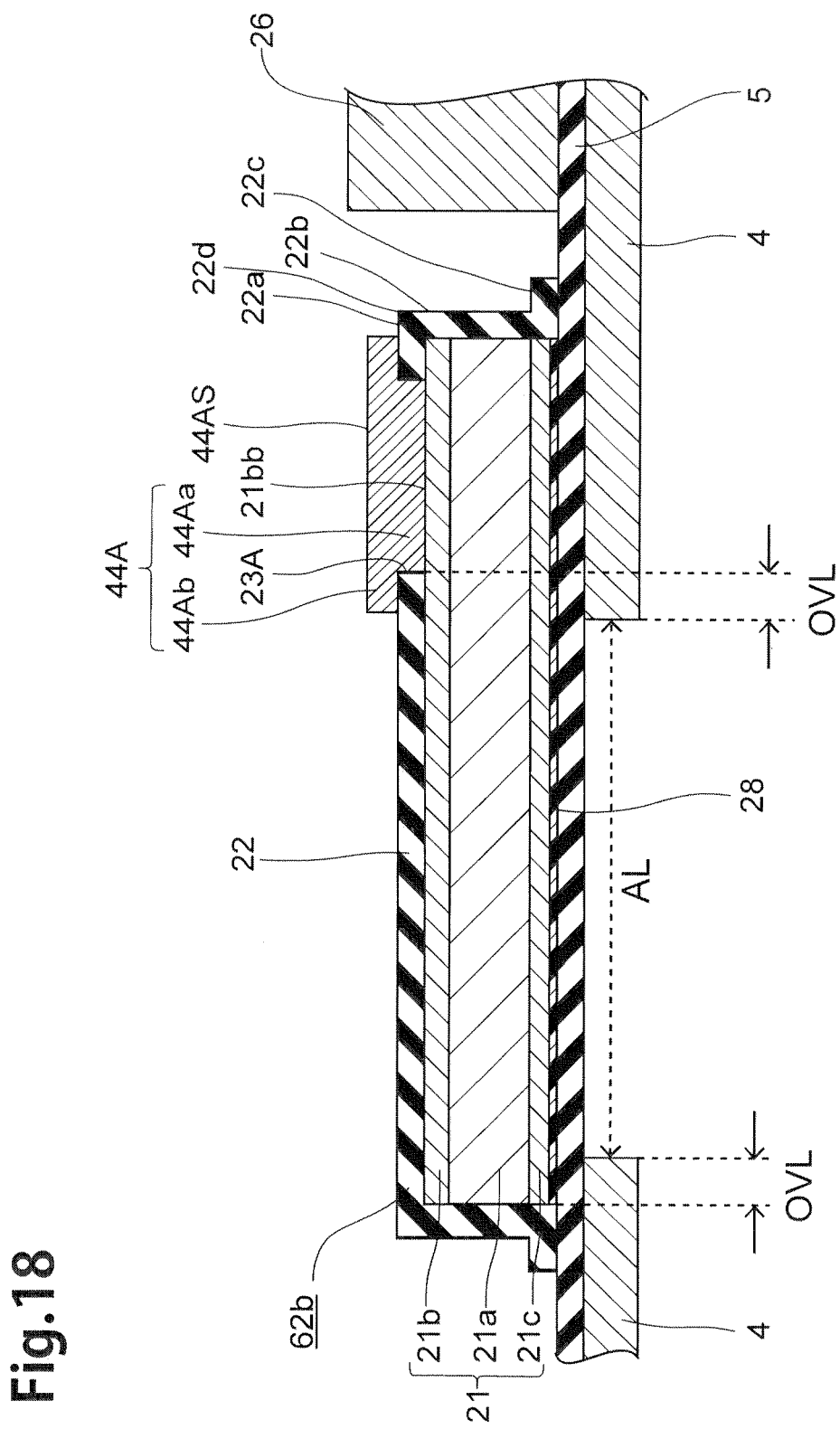
FIG. 18 is a sectional view taken along the line 18-18 in FIG. 17.
Figure 19:
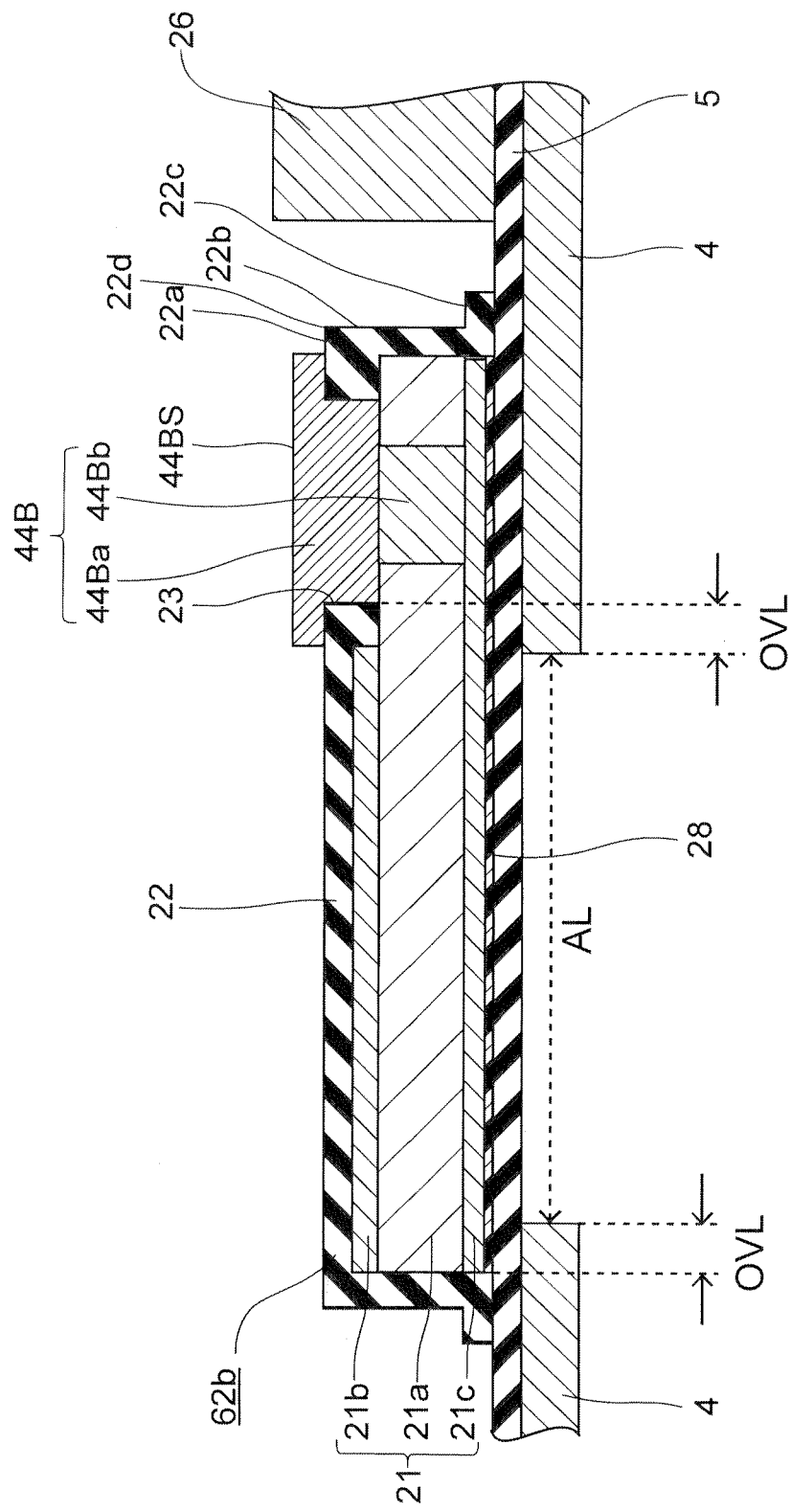
FIG. 19 is a sectional view taken along the line 19-19 in FIG. 17.
Figure 20:
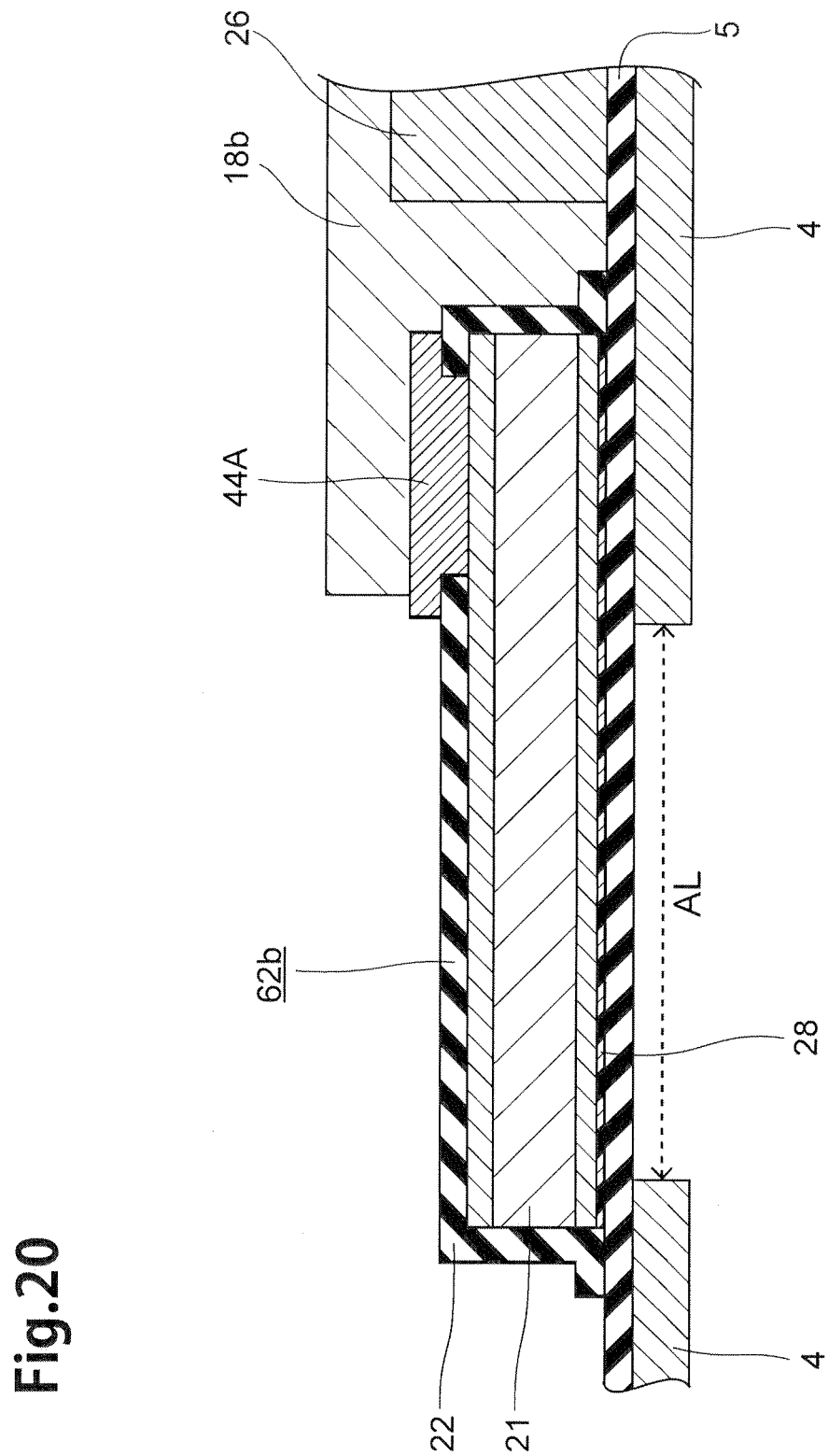
FIG. 20 is a sectional view, similar with FIG. 19, showing the thin-film piezoelectric material element, according to still another modified example, connected to the suspension pad by the connecting electrode.

Subsequently, the thin-film piezoelectric material element 62b according to the modified example 3 will be explained with reference to FIG. 17 to FIG. 20. Here, FIG. 17 is a plan view, similar with FIG. 5, showing the thin-film piezoelectric material element 62b and the peripheral part according to the modified example 3. FIG. 18 is a sectional view taken along the line 18-18 in FIG. 17, FIG. 19 is a sectional view taken along the line 19-19 in FIG. 17. FIG. 20 is a sectional view, similar with FIG. 19, showing the thin-film piezoelectric material element 62b, connected to the suspension pad 26 by the connecting electrode 18b. Note that the connecting electrode 18b is omitted in FIGS. 17-19 for convenience of illustration.

The thin-film piezoelectric material element 62b are different in that it has upper, lower electrode pads 44A, 44B instead of upper, lower electrode pads 24A, 24B, as compared with the thin-film piezoelectric material element 12b.

The upper electrode pad 44A have an inside pad part 44Aa and outside pad part 44Ab. The inside pad part 44Aa and outside pad part 44Ab are unified.

The inside pad part 44Aa is formed inside the upper through hole 23A, further it is in contact with the upper through hole 23A. The inside pad part 44Aa is formed in the rectangular parallelepiped shape. The inside pad part 44Aa is directly in contact with the inside exposed surface 21bb, and disposed entirely inside the outer edge part 22d. Further, the inside pad part 44Aa is formed without contact with the side disposed parts 22b.

The outside pad part 44Ab is a part, like flange, which extends outside the upper through hole 23A. The outside pad part 44Ab is formed on the surface layer insulating film 22. However, the outside pad part 44Ab is disposed entirely inside the outer edge part 22d. The outside pad part 44Ab is formed without contact with the side disposed parts 22b.

The upper electrode pad 44A has a long-pad length L44 and a short-pad length W44, it is preferable that the long-pad length L44 is less than the short-pad length W44 (L44≤W44).

Further, the upper electrode pad 44A has an outer end surface 44AS having rectangular shape in a plan view. As illustrated in FIG. 17, the fine mesh pattern is drawn in the outer end surface 44AS. As illustrated in FIG. 18, the outer end surface 44AS is a part formed outside the top disposed part 22a. The outer end surface 44AS is entirely flat. A part of the outer end surface 44AS is disposed outside the upper through hole 23A, but the outer end surface 44AS is entirely inside the outer edge part 22d.

As illustrated in FIG. 19, the lower electrode pad 44B have an upper pad part 44Ba and lower pad part 44Bb. The upper pad part 44Ba is connected to the top surface of the lower pad part 44Bb.

The upper pad part 44Ba have an inside pad part and outside pad part, similar with the upper electrode pad 44A, the inside pad part and outside pad part are unified. The upper pad part 44Ba is disposed entirely inside the outer edge part 22d, similar with the upper electrode pad 44A. Further, the upper pad part 44Ba is formed without contact with the side disposed parts 22b.

The lower pad part 44Bb penetrates the piezoelectric material film 21a. The lower pad part 44Bb is in directly contact with the top surface of the lower electrode film 21c.

As illustrated in FIG. 20, the thin-film piezoelectric material elements 62b, having the above-described structure, is connected to suspension pads 26, 26 with connecting electrode 18b. In this case, connecting electrodes 18b, 18b connect outer end surfaces 44AS, 44BS of the upper, lower electrode pads 44A, 44B to suspension pads 26, 26, respectively.

The above-described thin-film piezoelectric material elements 62b has the upper, lower through holes 23A, 23B, the upper, lower electrode pads 44A, 44B, and the surface layer insulating film 22.

Parts of the upper, lower electrode pads 44A, 44B are extended outside the upper, lower through holes 23A, 23B unlike the upper, lower electrode pads 24A, 24B, but the upper, lower electrode pads 44A, 44B are entirely not in contact with the side disposed parts 22, and the upper, lower electrode pads 44A, 44B are disposed entirely inside the outer edge part 22d. Therefore, in case of the thin-film piezoelectric material elements 62b, a space is also able to be secured along the long-side direction, similar with the thin-film piezoelectric material elements 12b, length of the laminated structure part 21 along the long-side direction can be made longer than a length of the laminated structure part 121 along the long-side direction.

Therefore, the active length of the thin-film piezoelectric material elements 62b is also extended than the active length of the thin-film piezoelectric material elements 112b, the active length AL is able to be extended than the conventional active length ALX. Accordingly, the stroke of the thin-film piezoelectric material elements 62*b* is increased than the stroke of the thin-film piezoelectric material elements 12*b*.

Further, when the long-pad length L44 of the upper, lower electrode pads 44A, 44B is shorter than the short-pad length W44, the space of the thin-film piezoelectric material elements 62*b* along the long-side direction is further extended, thereby the active length is further extended.

Further, the outer end surfaces 44AS, 44BS of the upper, lower electrode pads 44A, 44B are flat, and they do not have bending parts. Therefore, the thin-film piezoelectric material elements 62*b* is able to be approached, further space extension of the thin-film piezoelectric material elements 62*b* along the long-side direction is able to be executed.

(Embodiments of Hard Disk Drive)

Next, embodiments of the hard disk drive will now be explained with reference to FIG. 27.

Figure 27:
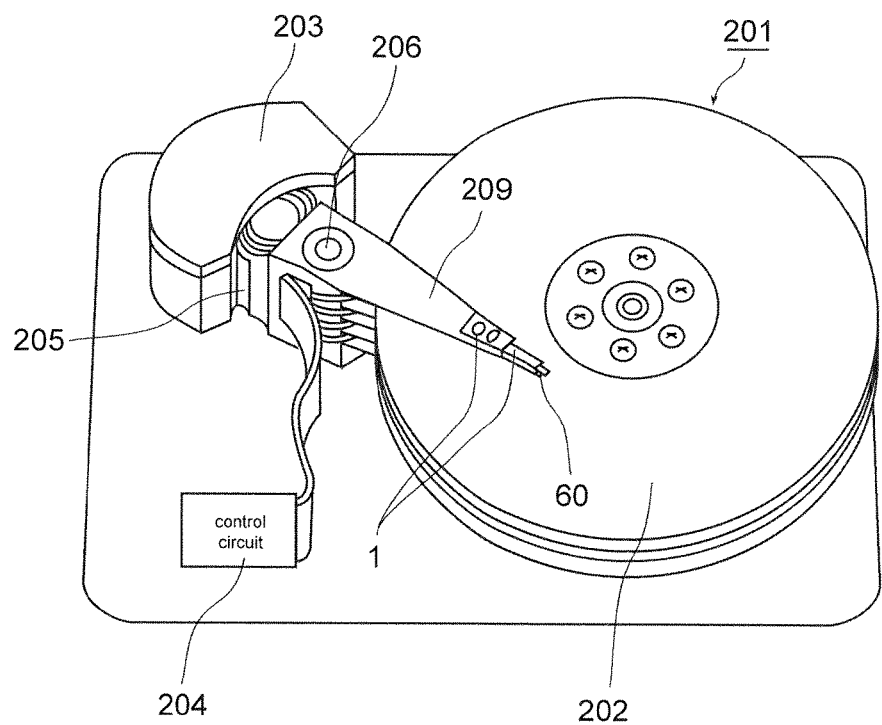
FIG. 27 is a perspective view showing a hard disk drive equipped with the HGA according to the embodiment of the present invention.

FIG. 27 is a perspective view illustrating a hard disk drive 201 equipped with the above-mentioned HGA 1. The hard disk drive 201 includes a hard disk (magnetic recording medium) 202 rotating at a high speed and the HGA 1. The hard disk drive 201 is an apparatus which actuates the HGA 1, so as to record/reproduce data onto/from recording surfaces of the hard disk 202. The hard disk 202 has a plurality of (4 in the drawing) platters. Each platter has a recording surface opposing its corresponding the head slider 60.

The hard disk drive 201 positions the head slider 60 on a track by an assembly carriage device 203. A thin-film magnetic head, not illustrated, is formed on this head slider 60. Further, the hard disk drive 201 has a plurality of drive arms 209. The drive arms 209 pivot about a pivot bearing shaft 206 by means of a voice coil motor (VCM) 205, and are stacked in a direction along the pivot bearing shaft 206. Further, the HGA 1 is attached to the tip of each drive arm 209.

Further, the hard disk drive 201 has a control circuit 204 controlling recording/reproducing.

In the hard disk drive 201, when the HGA 1 is rotated, the head slider 60 moves in a radial direction of the hard disk 202, i.e., a direction traversing track lines.

In case such hard disk drive 201 are formed with the above-described thin-film piezoelectric material elements 12*a*, 12*b*, because the extension of the active length brings the increase of the stroke, minute adjustment for position of the thin-film magnetic head is able to be executed accurately.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A thin-film piezoelectric material element comprising:
   a laminated structure part comprising a lower electrode film, a piezoelectric material film laminated on the lower electrode film and an upper electrode film laminated on the piezoelectric material film;
   a surface layer insulating film disposed on side surfaces of the laminated structure part and a top surface of the upper electrode film, and has a through hole formed on a top disposed part disposed on the top surface; and
   an upper electrode pad being in directly contact with an inside exposed surface, exposed inside the through hole, of the upper electrode film;
   wherein the upper electrode pad arranged entirely inside an outer edge part of the top disposed part, and formed without contact with a side disposed part, formed along with side surfaces of the laminated structure part, of the surface layer insulating film.

2. The thin-film piezoelectric material element according to claim 1,
   wherein the upper electrode pad has a long pad-length along with a long-side direction of the thin-film piezoelectric material element and a short pad-length along with a short-side direction of the thin-film piezoelectric material element,
   wherein the long pad-length is shorter than the short pad-length.

3. The thin-film piezoelectric material element according to claim 1,
   wherein the upper electrode pad has an outer end surface formed outside than the top disposed part,
   wherein the outer end surface is formed entirely flat, and disposed inside than the outer edge part of the top disposed part.

4. The thin-film piezoelectric material element according to claim 1,
   wherein the surface layer insulating film has a long-side disposed part disposed outside than the top disposed part along with a long-side direction of the thin-film piezoelectric material element,
   wherein the long-side disposed part has a long-side width, along with the long-side direction, formed shorter than the through hole.

5. The thin-film piezoelectric material element according to claim 4,
   wherein the inside exposed surface has a non pad-contact surface, formed partially, being out of contact with the upper electrode pad.

6. The thin-film piezoelectric material element according to claim 5,
   wherein the upper electrode pad is formed smaller than the inside exposed surface,
   wherein the non pad-contact surface is formed so as to surround the upper electrode pad.

7. The thin-film piezoelectric material element according to claim 3,
   wherein the outer end surface is disposed entirely inside the through hole.

8. The thin-film piezoelectric material element according to claim 3,
   wherein the outer end surface has an extended part disposed outside than the through hole,
   wherein the extended part is disposed inside than the outer edge part of the top disposed part.

9. A head gimbal assembly comprising a head slider having a thin-film magnetic head; a suspension for supporting the head slider; and a thin-film piezoelectric material element for displacing the head slider relatively to the suspension;
   wherein the thin-film piezoelectric material element comprising:
   a laminated structure part comprising a lower electrode film, a piezoelectric material film laminated on the lower electrode film and an upper electrode film laminated on the piezoelectric material film;
   a surface layer insulating film disposed on side surfaces of the laminated structure part and a top surface of the upper electrode film, and has a through hole formed on a top disposed part disposed on the top surface; and an upper electrode pad being in directly contact with an inside exposed surface, exposed inside the through hole, of the upper electrode film;

wherein the upper electrode pad arranged entirely inside an outer edge part of the top disposed part, and formed without contact with a side disposed part, formed along with side surfaces of the laminated structure part, of the surface layer insulating film.

10. The head gimbal assembly according to claim 9, wherein the upper electrode pad has an outer end surface formed outside than the upper disposed part, wherein the outer end surface is formed entirely flat, and disposed inside than the outer edge part of the top disposed part, wherein the head gimbal assembly further comprising:

a suspension pad formed on the suspension; and a connecting electrode which connects the outer end surface with the suspension pad.

11. A hard disk drive comprising a head gimbal assembly including a head slider having a thin-film magnetic head, a suspension for supporting the head slider, a thin-film piezoelectric material element for displacing the head slider relatively to the suspension; and a recording medium;

wherein the thin-film piezoelectric material element comprising:

a laminated structure part comprising a lower electrode film, a piezoelectric material film laminated on the lower electrode film and an upper electrode film laminated on the piezoelectric material film;

a surface layer insulating film disposed on side surfaces of the laminated structure part and a top surface of the upper electrode film, and has a through hole formed on a top disposed part disposed on the top surface; and an upper electrode pad being in directly contact with an inside exposed surface, exposed inside the through hole, of the upper electrode film;

wherein the upper electrode pad arranged entirely inside an outer edge part of the top disposed part, and formed without contact with a side disposed part, formed along with side surfaces of the laminated structure part, of the surface layer insulating film.

* * * * *